(12) United States Patent
Chen et al.

(10) Patent No.: US 12,721,053 B2
(45) Date of Patent: Aug. 25, 2026

(54) PHASE CHANGE MATERIAL SWITCH WITH EFFICIENT HEAT SPREADER AND METHODS FOR FORMING THE SAME

(71) Applicant: Taiwan Semiconductor Manufacturing Company Limited, Hsinchu (TW)

(72) Inventors: Han-Yu Chen, Hsinchu County (TW); Chang-Chih Huang, Taiwan (TW); Yu-Wen Wang, Taichung City (TW); Yi-Han Cheng, Tainan City (TW); Kuo-Chyuan Tzeng, Chu-Pei city (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 802 days.

(21) Appl. No.: 18/110,085

(22) Filed: Feb. 15, 2023

(65) Prior Publication Data

US 2024/0276897 A1 Aug. 15, 2024

(51) Int. Cl.
*H10N 70/00* (2023.01)
*H10N 70/20* (2023.01)

(52) U.S. Cl.
CPC ....... *H10N 70/8613* (2023.02); *H10N 70/231* (2023.02); *H10N 70/8828* (2023.02)

(58) Field of Classification Search
CPC ............... H10N 70/231; H10N 70/011; H10N 70/8413; H10N 70/063; H10N 70/253
See application file for complete search history.

(56) References Cited

U.S. PATENT DOCUMENTS 9,368,720 B1 * 6/2016 Moon ................ H10N 70/8828
10,461,253 B1 * 10/2019 Slovin .................. H10N 70/231
10,741,758 B2 * 8/2020 Howard ............... H10N 70/841
2014/0191181 A1 * 7/2014 Moon .................. H10N 70/011 257/4

(Continued)

OTHER PUBLICATIONS

Taiwan Patent and Trademark Office; Jianq Chyun Intellectual Property Office; TW application No. 112112828; Office Action dated Dec. 13, 2023; 14 pages.

*Primary Examiner* — Mounir S Amer
(74) *Attorney, Agent, or Firm* — The Marbury Law Group, PLLC

(57) ABSTRACT

A phase-change material switch may include a first interconnect-level dielectric, a heat spreader formed within the first interconnect-level dielectric, a second interconnect-level dielectric formed over the heat spreader, a phase change material element formed in or over the second interconnect-level dielectric, a first electrode and a second electrode in electrically conductive contact with the phase change material element, and a heating element coupled to the phase change material element and configured to supply a heat pulse to the phase change material element. The heat spreader may be located proximate to a first one of the phase change material element and the heating element, and the heat spreader may be smaller than the phase change material element. The heat spreader may be form using materials and processes similar to those used to form electrical interconnects, but unlike electrical interconnects, the heat spreader may be electrically isolated from electrical interconnects.

20 Claims, 37 Drawing Sheets

(56) References Cited

U.S. PATENT DOCUMENTS

2016/0071653 A1* 3/2016 Lamorey .............. H05B 3/0004
216/6
2019/0165264 A1* 5/2019 Wu ........................ H10B 63/10
2020/0058581 A1* 2/2020 El-Hinnawy ....... H01L 23/5222
2020/0058848 A1* 2/2020 El-Hinnawy ...... H10N 70/8613
2020/0075672 A1 3/2020 Slovin et al.
2020/0119266 A1 4/2020 Rose et al.
2021/0135100 A1 5/2021 Slovin et al.
2023/0343531 A1* 10/2023 Solomko ................ H01H 37/14
2024/0397733 A1* 11/2024 Hsieh ..................... H10B 63/80

* cited by examiner

2100

2300

PHASE CHANGE MATERIAL SWITCH WITH EFFICIENT HEAT SPREADER AND METHODS FOR FORMING THE SAME

BACKGROUND

Electronic devices may utilize switches to route a signal along a transmission path. For example, a communication device (e.g., cell phone) may include many antenna elements and multiple radio streams to ensure high data rate wireless communications, whether through cellular or mobile connectivity networks and peripheral devices. The communication device may utilize radio frequency (RF) switches to route an RF signal along a transmission path that may include multiple RF components such as amplifiers, filters, etc. Phase change material (PCM) switches may be used for various applications such as radio-frequency (RF) applications. Advantages of PCM switches include their immunity to interference by electromagnetic radiation, relatively fast switching times, and ability to maintain their switching state (i.e., "On" or "Off") without consuming electrical power.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
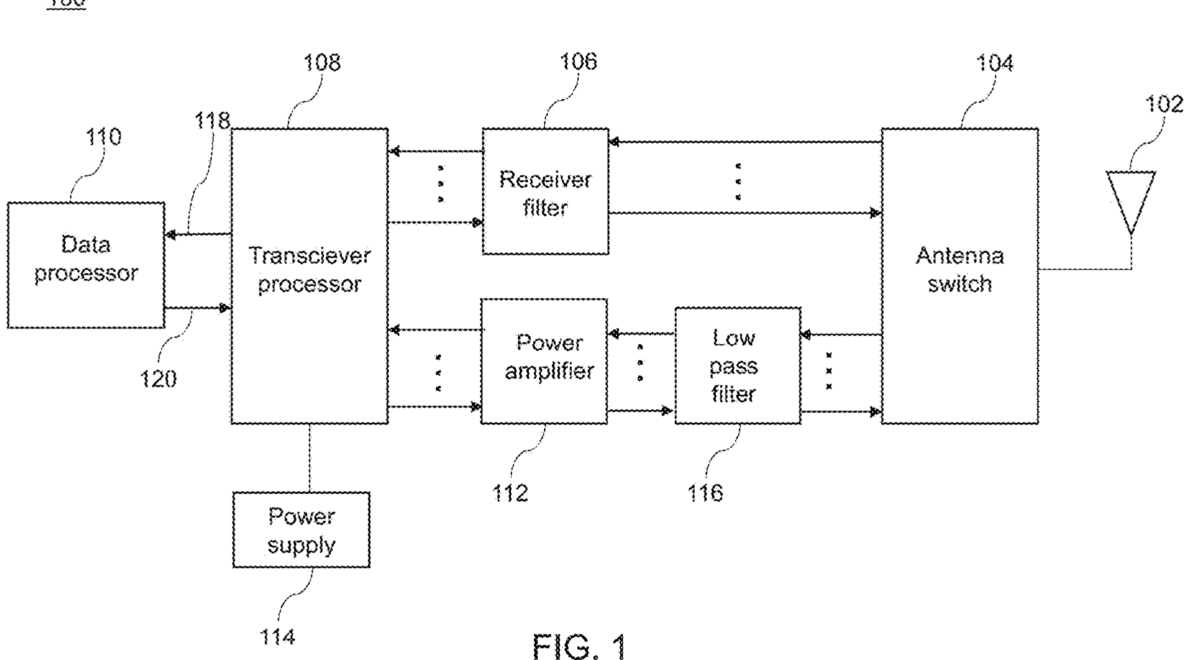
FIG. 1 is a block diagram of an RF transceiver system, according to various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Elements with the same reference numerals refer to the same element and are presumed to have the same material composition and the same thickness range unless expressly indicated otherwise.

Various embodiment structures and methods are disclosed herein that may be used to form a phase change material (PCM) switch. Various embodiment PCM switches may be used to provide a switching function for various semiconductor devices such as radio-frequency semiconductor devices, varactors (e.g., variable capacitance capacitors), inductors, or other semiconductor devices. As used herein, a "phase change material" refers to a material having at least two distinct phases providing different resistivity. The distinct phases may include an amorphous state having relatively high resistivity and a crystalline state having relatively low resistivity (i.e., a lower resistivity than in the amorphous state). The transition between the amorphous state and the crystalline state may be induced by controlling a time-versus-temperature thermal profile within the phase change material. For example, a PCM switch may include a resistive heating element thermally coupled to the phase change material and configured to selectively heat the phase change material via the application of current pulses through the resistive heating element.

To induce a transition of the phase change material from a low-resistivity crystalline state to a high-resistivity amorphous state, the current pulse through the resistive heating element may have a relatively short pulse width with a short falling time that is configured to quickly heat the phase change material to a temperature above its melting temperature ($T_{melt}$), causing the material to transition from an ordered crystalline low-resistivity phase to a disordered amorphous high-resistivity phase. The short falling time of the pulse may promote rapid quenching and may inhibit re-crystallization of the material as it cools.

To induce a transition of the phase change material from a high-resistivity amorphous state to a low-resistivity crystalline state, the current pulse through the resistive heating element may have a relatively longer pulse width with a longer pulse falling time that is configured to heat the phase change material to a temperature above its crystallization temperature ($T_{crys}$), but below its melting temperature ($T_{melt}$), over a time period sufficient to induce crystal nucleation in the material. The comparatively longer falling time of the current pulse may promote crystal growth as the phase change material cools at a relatively slower rate.

A PCM switch may include a phase change material disposed within a signal transmission pathway between a pair of electrodes. The resistive heating element may extend across the phase change material in a direction transverse to the signal transmission pathway, and a layer of electrically-insulating and thermally-conductive material may be disposed between the resistive heating element and the phase change material. While the phase change material is in a low-resistivity crystalline state, the PCM switch may be in an "On" state (i.e., the switch is closed) such that signals may be transmitted across the phase change material between the pair of electrodes. However, when a portion of the phase change material along the signal transmission pathway is in a high-resistivity amorphous state, the PCM switch may be in an "Off" state (i.e., the switch is open) such that signal transmission between the pair of electrodes is blocked. The PCM switch may be switched (i.e., programmed) between the "On" state and the "Off" state by the selective application of current pulses to the resistive heating element having different pulse widths and falling times as described above. The portion of the phase change material that is switched between a low-resistivity crystalline state and a high-resistivity amorphous state may be referred to as the active region of the phase change material.

Radio-frequency switches are commonly found in, among other things, wireless communication devices. Such switches may be configured to facilitate coupling various circuits of a wireless communication device to an antenna. For example, it may be desirable to couple a first set of circuits to the antenna when receiving information through the antenna and to couple a second set of circuits to the antenna when transmitting information. As another example, it may be desirable to couple a first set of circuits to the antenna when communicating via a first communication scheme and to couple a second set of circuits to the antenna when communicating via a second communication scheme.

For a switch used in radio-frequency (RF) applications, relevant factors for evaluating switch performance may include insertion loss, isolation, and power handling. In general, low insertion loss and high isolation are desirable characteristics for RF switches. For PCM switches, insertion loss may be related to the resistivity $R_{ON}$ across the phase change material when the switch is in the "On" state, while high isolation is inversely related to the capacitance $C_{OFF}$ of the switch while in the "Off" state. A figure of merit (FOM) that may be used to characterize performance of a PCM switch may be chosen to have a value that is inversely proportional to the product $R_{ON}*C_{OFF}$. For example, one FOM that may be used to characterize switch performance may be taken to be $\sim 1/(2\pi R_{ON}*C_{OFF})$. This FOM has frequency units and may be related to a maximum frequency at which the PCM material may be switched from an "On" state to an "Off" state. In general, increasing the value the FOM may be associated with improved switch performance. Thus, switch performance may be improved by reducing the $R_{ON}$ characteristics, reducing the $C_{OFF}$ characteristics, or both, in a PCM switch. The switching time of a PCM switch may also depend on a rate at which thermal energy may be diffused away from the PCM switch.

Various disclosed embodiments include PCM switches that may provide improved thermal confinement within the phase change material layer and improved thermal diffusion. In various embodiments, a thermally-conductive dielectric capping layer (e.g., including a high-k dielectric material) located between a heater pad and the phase change material layer of the PCM switch may be laterally-confined such that opposing sides of the dielectric capping layer and opposing sides of the underlying heater pad may form continuous surfaces extending transversely to the signal transmission pathway across the phase change material between the pair of electrodes.

The heat transfer from the heater pad through the dielectric capping layer to the phase change material layer may be predominantly along a vertically upwards direction, such that heating of the phase change material layer may be nearly exclusively confined to a region of the phase change material layer located directly above the heater pad, with minimal thermal dissipation along a lateral direction. This localized heating of the phase change material may improve the efficiency of the PCM switch by enabling the use of lower bias voltages across the heater pad and may minimize the occurrence of unwanted intermediate resistivity states within the phase change material layer.

The presence of a thermal spreader structure may improve removal of thermal energy after switching events. These structural features may, in turn, improve the $R_{ON}$ characteristics of the PCM switch. Further, because the laterally-confined dielectric capping layer is laterally offset from the electrodes contacting the phase change material layer, the relatively high-k dielectric capping layer may not significantly contribute to the $C_{OFF}$ characteristics of the switch. Accordingly, a high-performance PCM switch with an increased figure of merit (FOM) may be provided. In this regard, in some embodiments, the PCM switches may be formed in a BEOL process using logic-compatible processes in which the PCM switch is formed in proximity to interconnect structures.

An embodiment phase-change material switch may include a first interconnect-level dielectric, a heat spreader formed within the first interconnect-level dielectric, a second interconnect-level dielectric formed over the heat spreader, a phase change material element formed in or over the second interconnect-level dielectric, a first electrode and a second electrode in electrically conductive contact with the phase change material element, and a heating element coupled to the phase change material element and configured to supply a heat pulse to the phase change material element. The heat spreader may be located proximate to a first one of the phase change material element and the heating element, and the heat spreader may be smaller than the phase change material element. The heat spreader may be formed using materials and processes similar to those used to form electrical interconnects, but unlike electrical interconnects, the heat spreader may be electrically isolated from electrical interconnects.

In a further embodiment, a phase-change material switch may include a heat spreader, an interconnect, an interconnect-level dielectric separating the heat spreader from the interconnect, a phase change material element having a first electrode and a second electrode formed within the interconnect-level dielectric, and a heating element coupled to the phase change material element and configured to supply a heat pulse to the phase change material element. The phase change material element may include a phase change material, and the interconnect may further include a first interconnect line connected to the first electrode and a second interconnect line connected to the second electrode such that the first electrode, the second electrode, the phase change material element, and the heating element are configured as a radio frequency switch.

An embodiment method of forming a phase-change material switch may include forming a first interconnect-level dielectric, forming a heat spreader within the first interconnect-level dielectric, forming a second interconnect-level dielectric over the heat spreader, forming a phase change material element in or over the second interconnect-level dielectric, forming a heating element coupled to the phase change material element, forming a first electrode in contact with the phase change material element, and forming a second electrode in contact with the phase change material element. The phase change material element may include a phase change material, and the first electrode, the second electrode, the heating element, and the phase change material element may be configured as a radio frequency switch.

FIG. 1 is an exemplary block diagram of an RF transceiver system 100, according to various embodiments. The RF transceiver system 100 may include at least one antenna 102, an antenna switch 104, a receiver filter 106, a transceiver processor 108, a data processor 110, a power amplifier 112, a power supply 114, and a low-pass filter 116. In some embodiments, the antenna switch 104 may be used to direct a signal from the antenna 102 to the receiver filter 106 or from the low pass filter 116 output to the antenna 102. The antenna switch may have low loss (e.g., <0.1 dB) to avoid adding to system noise or attenuating the transmit signal.

In some embodiments, the receiver filter 106 may be configured to filter signals to eliminate out-of-band signals so that such out-of-band signals may not be amplified or impact the linearity of the transceiver processor 108. In some embodiments, the transceiver processor 108 may further include at least one of a low noise amplifier, an RF filter, a mixer, a demodulator, a digital-to-analog converter, an analog-to-digital converter, and a modulator. First data 118, which may be received from the receiver filter 106 may be provided to a data processor 110. Similarly, second data 120, which is to be provided to the antenna 102 for transmission by the antenna 102, may be provided from the data processor 110 to the transceiver processor 108.

After being processed by the transceiver processor 108, the second data 120 may be amplified by the power amplifier 112 and may be filtered by the low pass filter 116 before being provided to the antenna switch 104. In turn, the antenna switch 104 may provide the second data 120, received from the low pass filter 116, to the antenna 102 for transmission. In the illustrated embodiment RF transceiver system 100, the antenna switch 104 may share one antenna 102 in transmission and reception and may be configured and controlled to switch the signal path. In some embodiments, the antenna switch 104 may be configured to exhibit low loss and low power consumption.

Figures 2A, 2B:
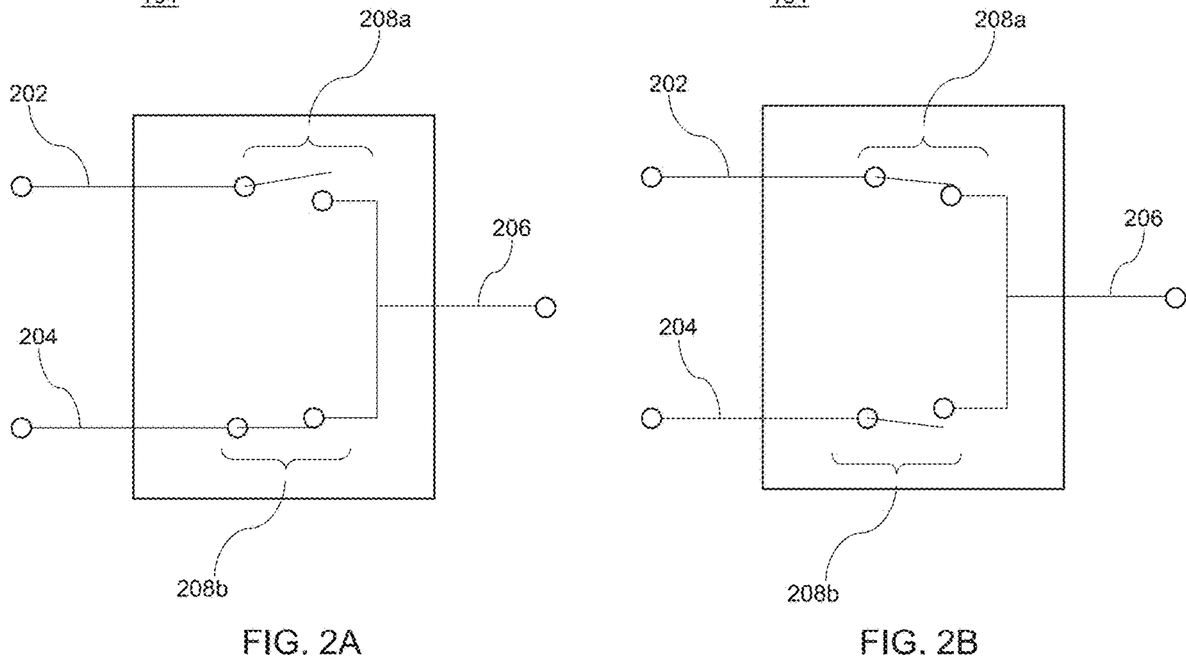
FIG. 2A is a schematic illustration of an antenna switch in a first configuration, according to various embodiments.
FIG. 2B is a schematic illustration of the antenna switch in a second configuration, according to various embodiments.

FIG. 2A is a schematic illustration of the antenna switch 104 in a first configuration, and FIG. 2B is a schematic illustration of the antenna switch 104 in a second configuration. The antenna switch 104 may include a receive node 202, a transmit node 204, and an antenna node 206. The antenna switch 104 may include a first RF switch 208*a* and a second RF switch 208*b*. As shown in FIG. 2A, in a first configuration, the first RF switch 208*a* may be open and the second RF switch 208*b* may be closed. As such, the antenna node 206 may be electrically connected to the transmit node 204. Alternatively, as shown in FIG. 2B, the first RF switch 208*a* may be closed and the second RF switch 208*b* may be open. As such, the antenna node 206 may be electrically connected to the receive node 202.

FIGS. 2A and 2B, suggest that the antenna switch 104 may be implemented using two RF switches (208*a*, 208*b*). Such RF switches (208*a*, 208*b*) may each be implemented using one or more transistors, resistors, inductors, capacitors, diodes, etc. For example, the antenna switch 104 may include various other circuit components such as a voltage controller. In various embodiments, various circuit components may include switching elements including one or more suitable electronic switches, such as insulated gate bipolar transistors (IGBTs), bipolar junction transistors (BJTs), field-effect transistors (FETs), metal-oxide semiconductor field-effect transistors (MOSFETs), gate turnoff thyristors (GTOs), integrated gate-commutated thyristors (IGCTs), bidirectional triode thyristors (TRIACs), etc. Various other embodiments may be implemented using high-performance PCM switch elements, as described in greater detail below.

Figure 3A:
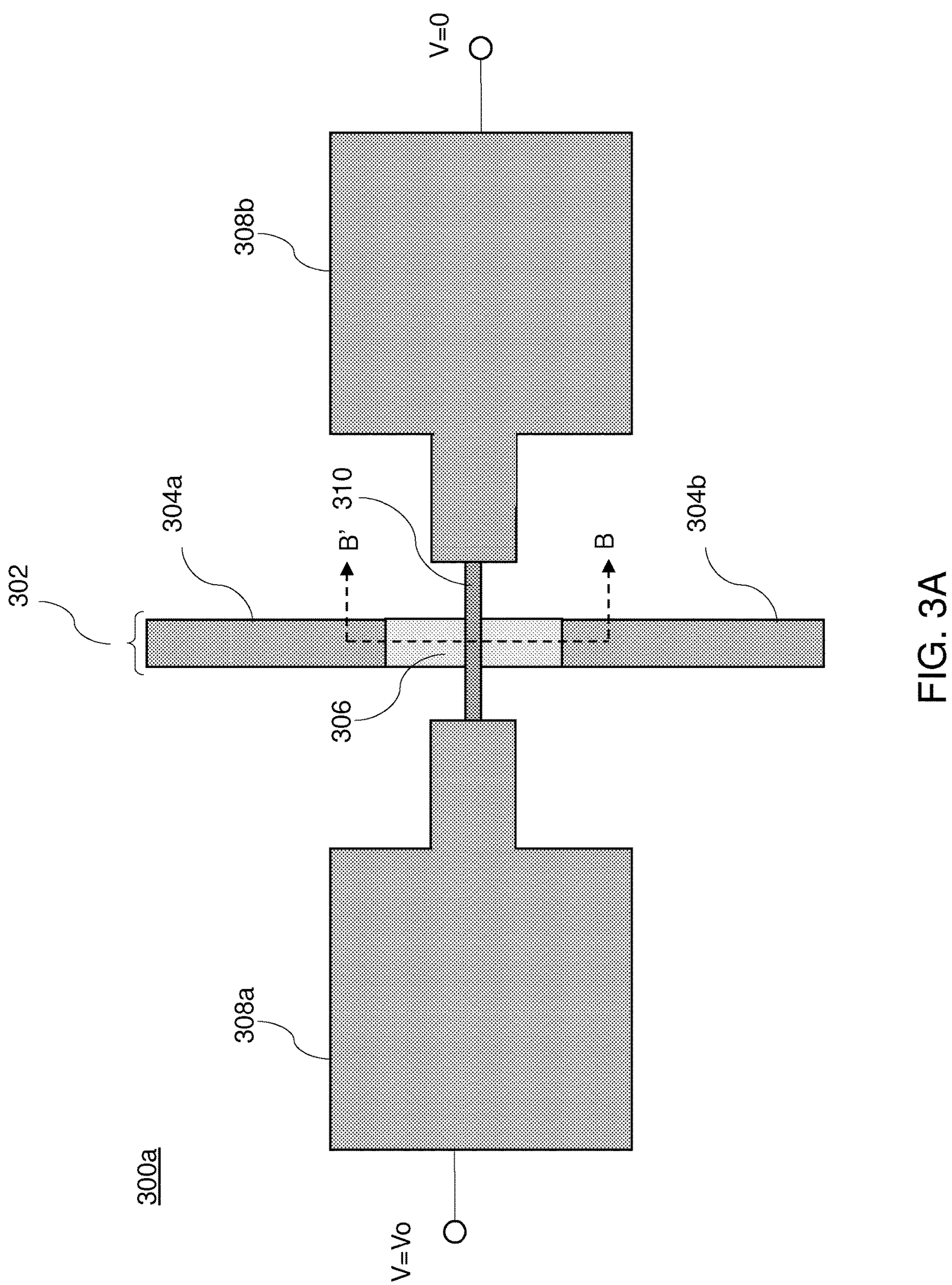
FIG. 3A is a top view of a PCM switch, according to various embodiments.
Figure 3B:
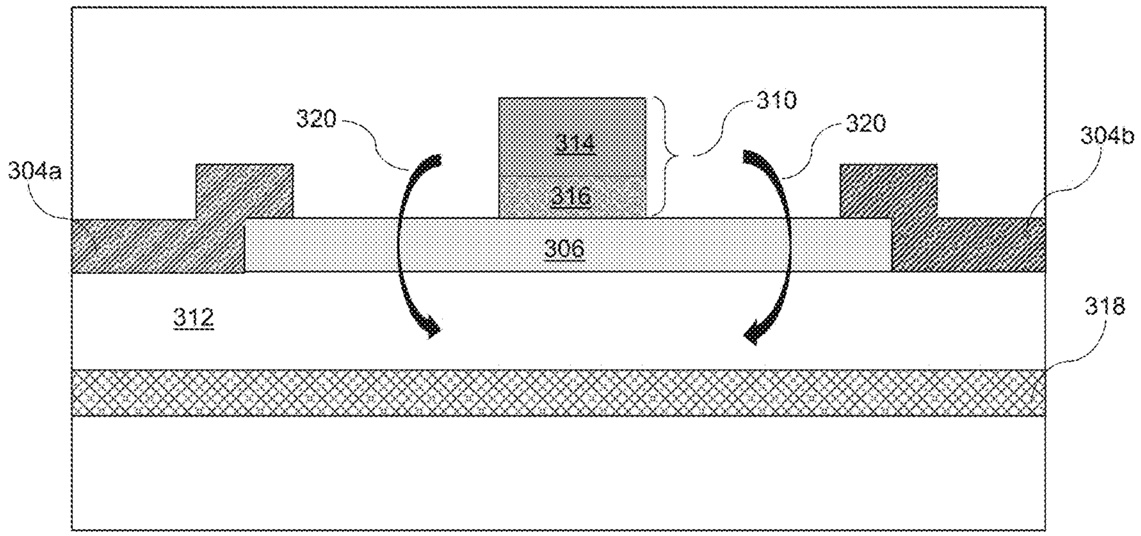
FIG. 3B is a vertical cross-sectional view of a portion of the PCM switch of FIG. 3A, according to various embodiments.

FIG. 3A is a top view of a PCM switch 300*a*, and FIG. 3B is a vertical cross-sectional view of a portion of the PCM switch 300*a* of FIG. 3A, according to various embodiments. The vertical cross-sectional plane that defines the view of FIG. 3B is indicated by the cross-section B-B' in FIG. 3A. The PCM switch 300*a* may include an RF signal line 302 having a first RF conductor 304*a* and a second RF conductor 304*b*. The PCM switch 300*a* may further include a phase change material element 306 that may be in contact with the first RF conductor 304*a* and the second RF conductor 304*b*. As described above, the phase change material element 306 may be in a conducting state or in an insulating state. In instances in which the phase change material element 306 is in a conducting state, the PCM switch is closed (i.e., the switch is in an "On" state) and RF signals may propagate along the RF signal line 302 from the first RF conductor 304*a* to the second RF conductor 304*b* or from the second RF conductor 304*b* to the first RF conductor 304*a*. In instances in which the phase change material element 306 is in an insulating state, the PCM switch 300*a* is open (i.e., the switch is in an "Off state) and propagation of RF signals along the RF signal line 302 is prevented.

The PCM switch 300*a* may further include a first heater pad 308*a* and a second heater pad 308*b*. The first heater pad 308*a* and the second heater pad 308*b* may each be electrically connected to a heating element 310. The first heater pad 308*a*, the second heater pad 308*b*, and the heating element 310 may each be formed of a conducting material. In some embodiments, each of the first heater pad 308*a*, the second heater pad 308*b*, and the heating element 310, may be formed of the same conducting material. Alternatively, two or more different electrically conducting materials may be used for the first heater pad 308*a*, the second heater pad 308*b*, and the heating element 310.

Application of voltage difference between the first heater pad 308*a* (e.g., held at V=Vo) and the second heater pad 308*b* (e.g., held at V=0) may generate an electrical current that may flow from the first heater pad 308*a*, through the heating element 310, and to the second heater pad 308*b*, or from the second heater pad 308*b*, through the heating element 310, and to the first heater pad 308*a*, depending on the sign of the applied voltage Vo. The resistance of a given electrical circuit element (e.g., each of the first heater pad 308*a*, the second heater pad 308*b*, and the heating element 310) is proportional to a length along the direction of current flow and inversely proportional to a cross-sectional area perpendicular to current flow. As such, the first heater pad 308*a* and the second heater pad 308*b* may be configured to have a considerably larger width than that of the heating element 310. Therefore, for a given applied voltage difference, the current density may be considerably larger in the heating element 310 relative to that in either of the first heater pad 308*a* and the second heater pad 308*b*. As such, heat generated due to Ohmic loss will be produced at a greater rate (i.e., have a greater value of $1^2R$ power) in the heating element 310 in comparison with heat generated in the first heater pad 308*a* and the second heater pad 308*b*. As such, heat may be preferentially generated by the heating element 310 and may be delivered to the phase change material element 306.

As shown in FIG. 3B, the PCM switch 300*a* may include a phase change material element 306 electrically connected to the first RF conductor 304*a* and to the second RF conductor 304*b*. Each of the first RF conductor 304*a*, the second RF conductor 304*b*, and the phase change material element 306 may be formed over a first switch dielectric material layer 312. As described in greater detail below, the heating element 310 may be formed above the phase change material element 306 such as to be in contact with a portion of the phase change material element 306. In this example embodiment, the heating element 310 may include a conductive heater pad 314 and a capping layer 316. Further, the capping layer 316 may be an electrically insulating material while being a heat conductor.

As shown in FIG. 3B, the PCM switch 300*a* may further include a heat spreader 318 formed below the phase change material element 306 on an opposite side of the phase change material element 306 from the heating element 310. The heat spreader 318 may be formed of a material having a high thermal conductivity. For example, the heat spreader 318 may have a planar slab geometry and may be a metal or a compound semiconductor (e.g., SiC) having a high thermal conductivity (e.g., >100 W/mK). The heat spreader 318 may be configured to remove heat from the phase change material element 306 during a cool-down phase after a switching event (e.g., switching from insulating to conducting or from conducting to insulating). As shown, the heat spreader 318 may be configured to cause heat to flow preferentially from the heating element 310, through the phase change material element 306, and toward the heat spreader 318, as indicated by the arrows 320 shown in FIG. 3B. Thus, the heating element 310 may be coupled to a first side (e.g., the top side) of the phase change material element 306 and the heat spreader 318 may be formed on a second side (e.g., the bottom side) of the phase change material element 306 opposite to the heating element 310. In other embodiments, however, the heat spreader 318 and the heating element 310 may be formed on the same side of the phase change material element 306 as described with reference to FIG. 3C, below.

Figure 3C:
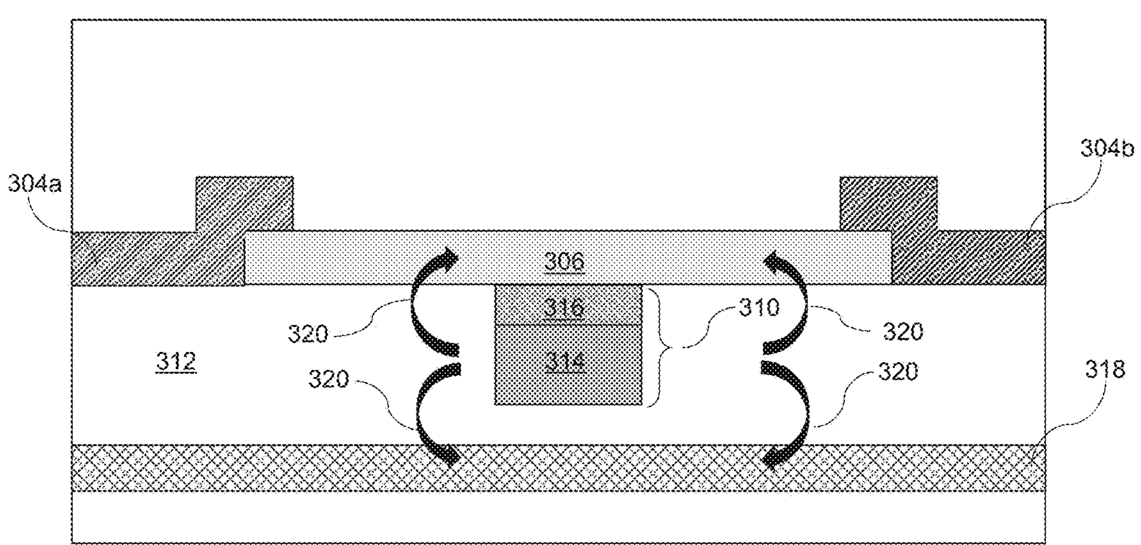
FIG. 3C is a vertical cross-sectional view of a further PCM switch, according to various embodiments.

FIG. 3C is a top view of a further PCM switch 300*c*, according to various embodiments. In this example embodiment, the PCM switch 300*c* is configured to have the heating element 310 and the heat spreader 318 on the same side (i.e., the lower side) of the phase change material element 306. Thus, as shown by the arrows 320, heat may flow from the heating element 310 both toward the phase change material element 306 and toward the heat spreader 318. The PCM switch 300*c* may have advantages or disadvantages relative to the PCM switch 300*a* depending on the relative heat capacities of the heating element 310 and the phase change material element 306.

For example, the PCM switch 300*c* may exhibit a disadvantage relative to the PCM switch 300*a* of FIGS. 3A and 3B in that heat may be drawn away from the heating element 310 and the phase change material element 306 (e.g., downward in FIG. 3C) leading to an inefficiency of heating the phase change material element 306. The embodiment of FIG. 3B may therefore provide an advantage over the embodiment of FIG. 3C in that the phase change material element 306 may be directly quenched (i.e., heat removed) after a switching event leading to a faster switching time and more efficient heating of the phase change material element 306 (relative to embodiments in which the heat spreader 318 may be placed on the same side as the heating element 310). However, in embodiments in which the heat capacity of the heating element 310 is significantly greater than that of the phase change material element 306, it may be advantageous to have the heat spreader 318 next to the heating element 310, as shown in FIG. 3C, so that heat may be rapidly drawn away from the heating element 310 after a switching event.

Figures 3D, 3E:
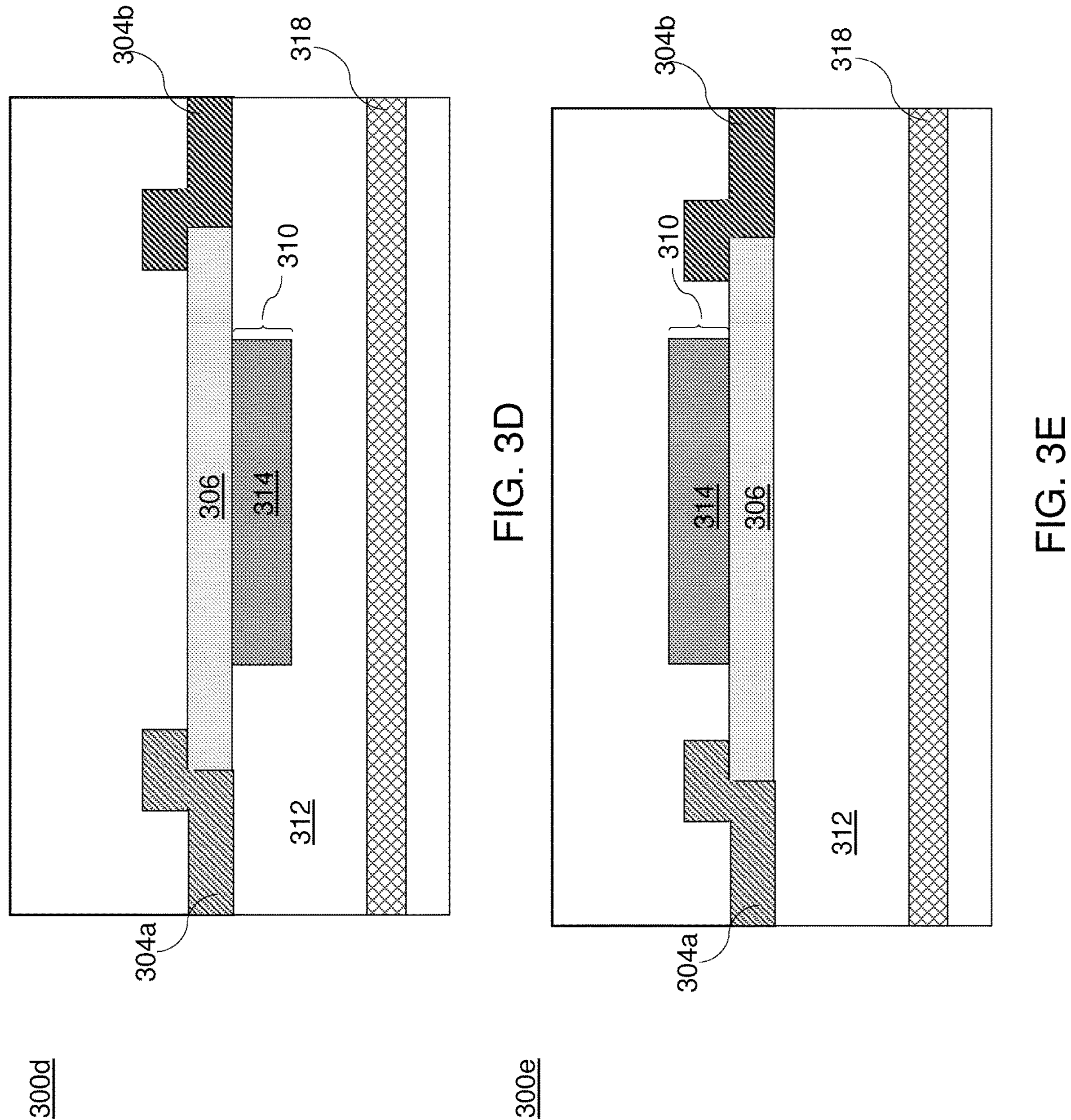
FIG. 3D is a vertical cross-sectional view of a further PCM switch, according to various embodiments.
FIG. 3E is a vertical cross-sectional view of a further PCM switch, according to various embodiments.

FIGS. 3D and 3E are vertical cross-sectional views further PCM switches (300*d*, 300*e*), according to various embodiments. In contrast to the embodiments of FIGS. 3A to 3C, the heating element 310 may include the heater pad 314 formed directly in contact with the phase change material element 306 (i.e., without the capping layer 316). Further, as shown respectively in FIGS. 3D and 3E, the heating element 310 may be formed on the same side or on the opposite side of the phase change material element 306 as the heat spreader 318. As described with reference to FIG. 3C, above, one or the other of the PCM switches (300*d*, 300*e*) may exhibit better performance depending on the relative heat capacities of the various components of the PCM switches (300*d*, 300*e*).

Figure 4A:
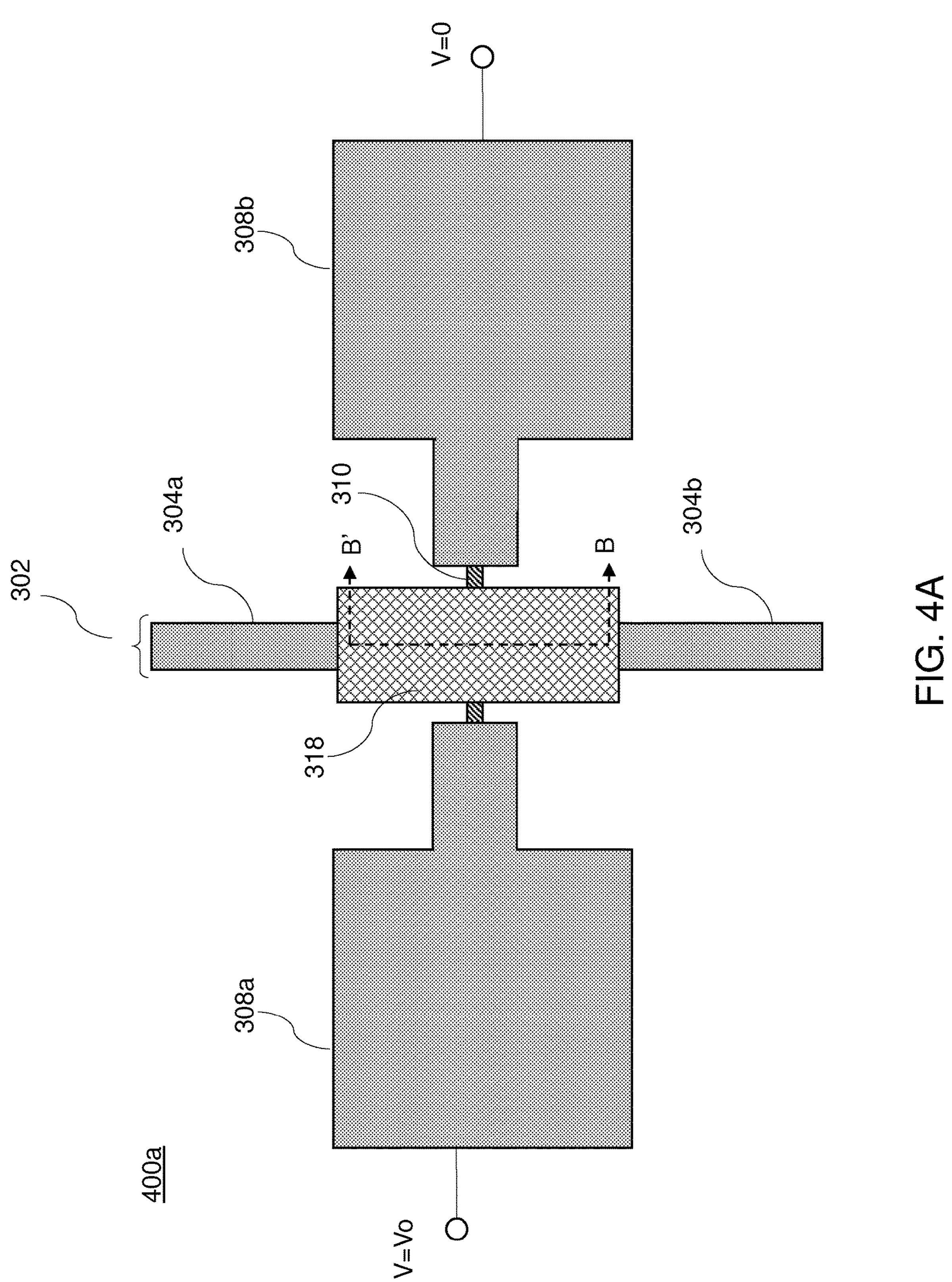
FIG. 4A is a top view of a further PCM switch, according to various embodiments.
Figure 4B:
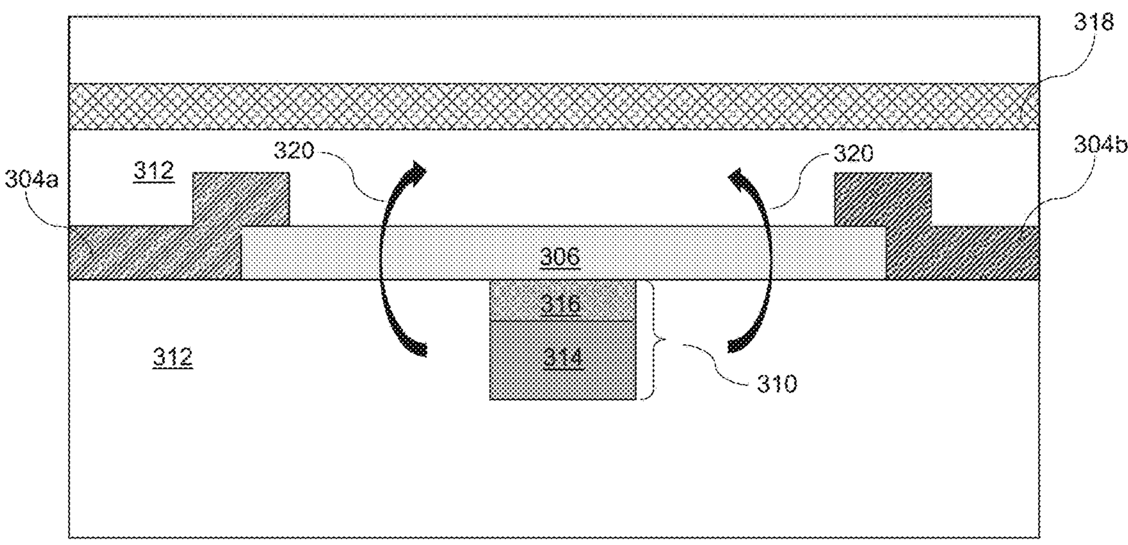
FIG. 4B is a vertical cross-sectional view of the PCM switch of FIG. 4A, according to various embodiments.

FIG. 4A is a top view of a further PCM switch 400*a*, and FIG. 4B is a vertical cross-sectional view of a portion of the PCM switch 400*a* of FIG. 4A, according to various embodiments. The vertical cross-sectional plane that defines the view of FIG. 4B is indicated by the cross-section B-B' in FIG. 4A. The PCM switch 400*a* may have many of the same or similar components as those of the PCM switch 300*a*. In contrast to the embodiment PCM switch 300*a* of FIGS. 3A and 3B, however, the PCM switch 400*a* of FIG. 4A may include a configuration in which the position of the heating element 310 and the heat spreader 318 are swapped (e.g., heat spreader 318 above and heating element 310 below the phase change material element 306). As such, heat may preferentially flow from the heating element 310, through the phase change material element 306, and toward the heat spreader 318 in the opposite direction (e.g., up) from that of the embodiment of FIG. 3B, as shown by the arrows 320 in FIG. 3B. Thus, the heating element 310 may be coupled to a first side (e.g., the bottom side) of the phase change material element 306 and the heat spreader 318 may be formed on a second side (e.g., the top side) of the phase change material element 306 opposite to the heating element 310.

As shown in FIGS. 3B and 4B, the heating element 310 may have a localized spatial extent relative to the phase change material element 306. As such, heat may be applied to the phase change material element 306 in a localized distribution. The localized spatial distribution of heat provided to the phase change material element 306 may reduce a power required to switch the phase change material. Further, the presence of the heat spreader 318 may provide more efficient removal of heat following switching events, which may increase a switching speed of the PCM switch.

In some embodiments, the heat spreader 318 may include a metal or a compound semiconductor having a thermal conductivity greater than 100 W/mK. The heat spreader 318 may also include Cu or SiC. The heat spreader 318 may further be electrically isolated from the heating element 310 and the phase change material element 306 (e.g., see FIG. 4B). The heat spreader 318 may further be separated from the phase change material element 306 by an electrically insulating material (e.g., first switch dielectric material layer 312) having a thermal conductivity in a range from approximately 0.1 W/mK to approximately 50 W/mK.

Further, the phase change material element 306 may include a material having a thermal conductivity in a range from approximately 2.5 W/mK to approximately 10 W/mK. The phase change material element 306 may include at least one of a germanium telluride compound, an antimony telluride compound, a germanium antimony telluride compound, a germanium antimony compound, an indium germanium telluride compound, an aluminum selenium telluride compound, an indium selenium telluride compound, and an aluminum indium selenium telluride compound.

The heating element 310 may include a heater pad 314 that generates heat when an applied voltage generates a current through the heater pad 314. The heater pad 314 may further include a material that is at least one of tungsten, tungsten nitride, titanium nitride, and a nickel silicide. Other suitable materials are within the contemplated scope of disclosure. Further, the heater pad 314 may include a material having a thermal conductivity greater than 175 W/mK.

The PCM switches (300*a*, 300*c*, 400*a*, 400*c*) may further include a dielectric capping layer 316 that is in contact with the phase change material element 306 and that separates the heater pad 314 from the phase change material element 306. The dielectric capping layer 316 may include an electrical insulator having a thermal conductivity greater than 100 W/mK. The dielectric capping layer 316 may include at least one of silicon nitride, silicon carbide, silicon carbide nitride, and aluminum nitride. In some embodiments, the phase change material element 306 may be configured to switch from the conducting phase to the insulating phase within a time that is approximately $5.0\times10^{-7}$ sec or less.

The first RF conductor 304*a*, the second RF conductor 304*b*, and the phase change material element 306 may be configured to form an RF switch (300*a*, 300*c*, 400*a*, 400*c*) that may block RF signals when the phase change material element 306 is the electrically insulating phase and may conduct RF signals when the when the phase change material element 306 is in the electrically conducting phase. The heat spreader 318 may be formed on a second side of the phase change material element 306 opposite to the heating element 310 (e.g., see FIG. 4B). In certain embodiments, the heat spreader 318 may include a metal or a compound semiconductor having a thermal conductivity greater than 100 W/mK. Further, heat spreader 318 may be electrically isolated from the heating element 310 and the phase change material element 306.

Figure 4C:
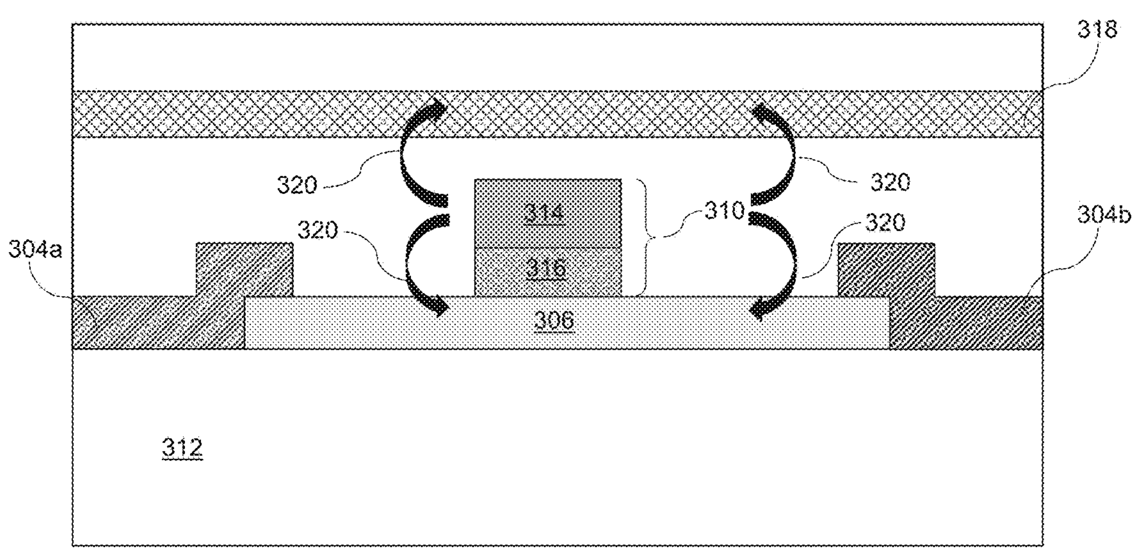
FIG. 4C is a vertical cross-sectional view of a further PCM switch, according to various embodiments.

FIG. 4C is a vertical cross sectional view of a further PCM switch 400*c*, according to various embodiments. In this example embodiment, the PCM switch 400*c* may be configured to have the heating element 310 and the heat spreader 318 on the same side (i.e., the upper side) of the phase change material element 306. Thus, as shown by the arrows 320, heat may flow from the heating element 310 both toward the phase change material element 306 and toward the heat spreader 318. The PCM switch 400*c* may have advantages or disadvantages relative to the PCM switch 400*a* depending on the relative heat capacities of the heating element 310 and the phase change material element 306.

For example, the PCM switch 400*c* may exhibit a disadvantage relative to the PCM switch 400*a* of FIGS. 4A and 4B in that heat may be drawn away from the heating element 310 and the phase change material element 306 (e.g., upward in FIG. 4C) leading to an inefficiency of heating the phase change material element 306. The embodiment of FIG. 4B may therefore provide an advantage over the embodiment of FIG. 4C in that the phase change material element 306 may be directly quenched (i.e., heat removed) after a switching event leading to a faster switching time and more efficient heating of the phase change material element 306 (relative to embodiments in which the heat spreader 318 may be placed on the same side as the heating element 310). However, in embodiments in which the heat capacity of the heating element 310 is significantly greater than that of the phase change material element 306, it may be advantageous to have the heat spreader 318 next to the heating element 310, as shown in FIG. 4C, so that heat may be rapidly drawn away from the heating element 310 after a switching event.

Figures 4D, 4E:
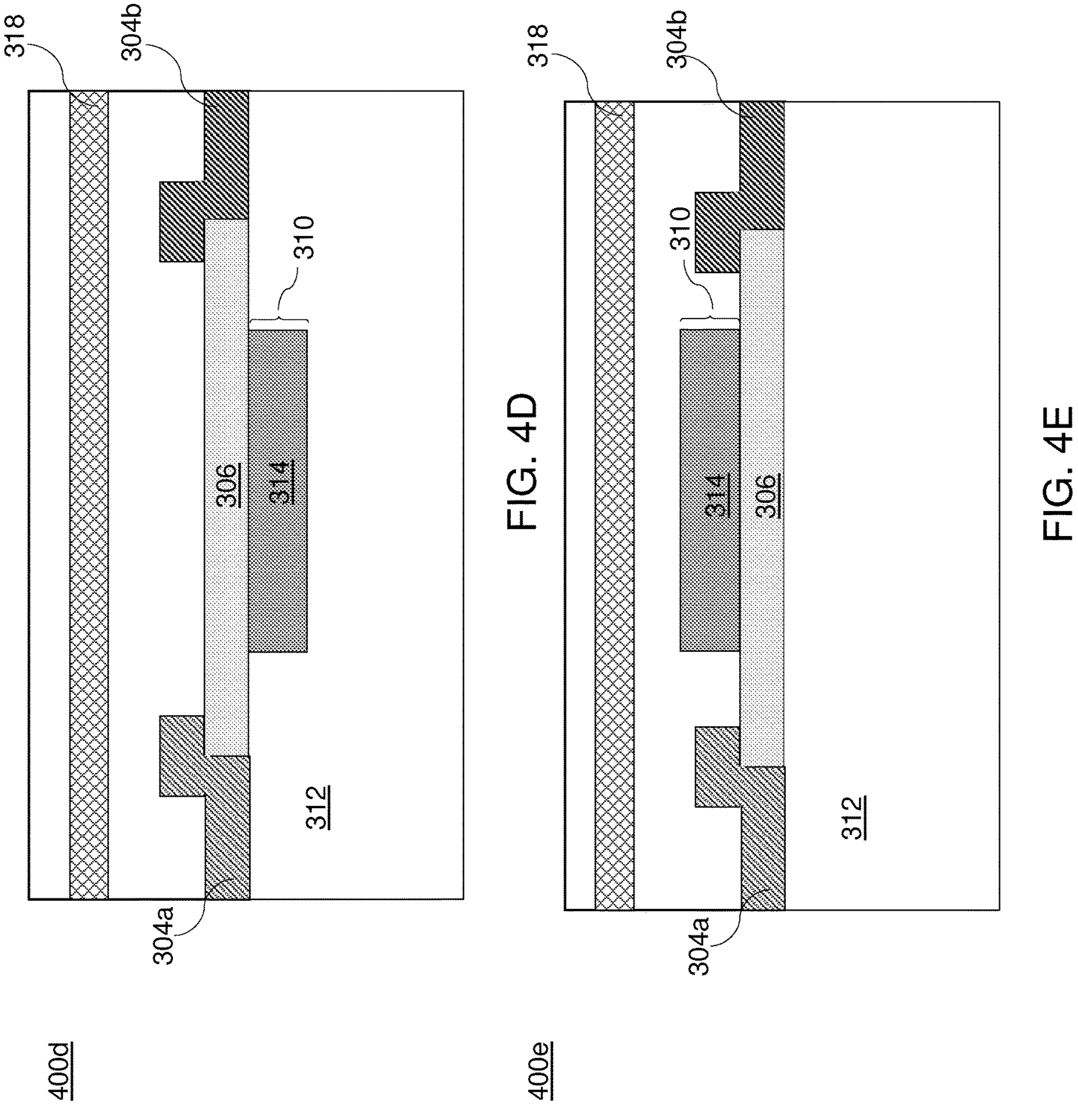
FIG. 4D is a vertical cross-sectional view of a further PCM switch, according to various embodiments.
FIG. 4E is a vertical cross-sectional view of a further PCM switch, according to various embodiments.

FIGS. 4D and 4E are vertical cross-sectional views further PCM switches (400*d*, 400*e*), according to various embodiments. In contrast to the embodiments of FIGS. 4A to 4C, the heating element 310 may include the heater pad 314 formed directly in contact with the phase change material element 306 (i.e., without the capping layer 316). Further, as shown respectively in FIGS. 4D and 4E, the heating element 310 may be formed on the same side or on the opposite side of the phase change material element 306 as the heat spreader 318. As described with reference to FIG. 4C, above, one or the other of the PCM switches (400*d*, 400*e*) may exhibit better performance depending on the relative heat capacities of the various components of the PCM switches (400*d*, 400*e*).

Figures 5A, 5B:
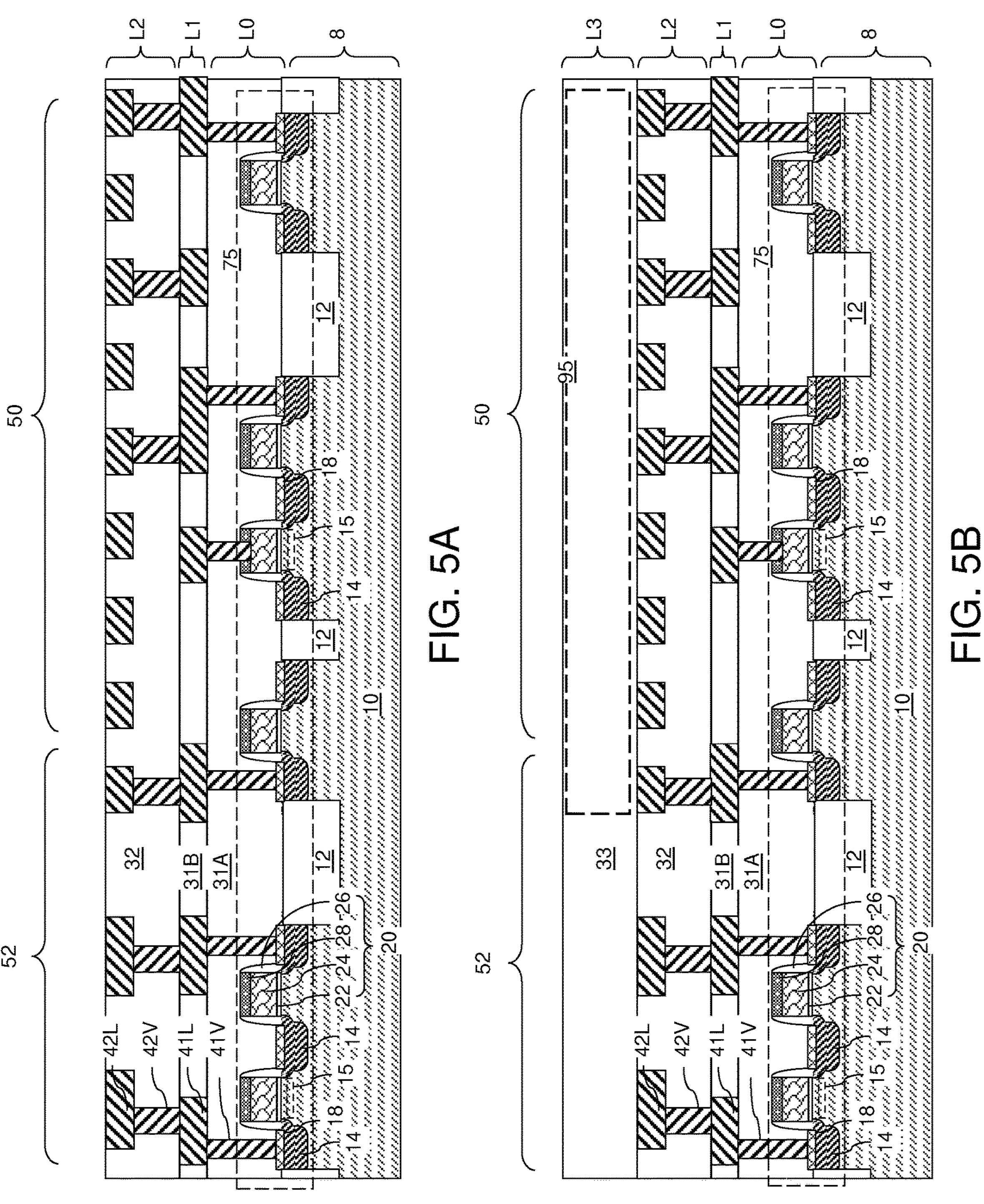
FIG. 5A is a vertical cross-sectional view of a structure after formation of complementary metal-oxide-semiconductor (CMOS) transistors, metal interconnect structures, and dielectric material layers, according to various embodiments.
FIG. 5B is a vertical cross-sectional view of a further structure during formation of a phase-change material switch, according to various embodiments.

FIG. 5A is a vertical cross-sectional view of a structure after formation of complementary metal-oxide-semiconductor (CMOS) transistors, metal interconnect structures, and dielectric material layers, according to various embodiments. The first structure may include a substrate 8, which may be a semiconductor substrate such as a commercially available silicon substrate. The substrate 8 may include a semiconductor material layer 10 at least at an upper portion thereof. The substrate 8 may include a bulk semiconductor substrate such as a silicon substrate in which the semiconductor material layer continuously extends from a top surface of the substrate 8 to a bottom surface of the substrate 8, or a semiconductor-on-insulator (SOI) layer including the semiconductor material layer 10 as a top semiconductor layer overlying a buried insulator layer (such as a silicon oxide layer). The structure may include various devices regions, which may include a switching region 50 in which at least one or more PCM switches may be subsequently formed.

The structure may also include a peripheral logic region 52 in which electrical connections between PCM switches and various peripheral circuits including field effect transistors may be subsequently formed. Semiconductor devices such as field effect transistors (FETs) may be formed on, and/or in, the semiconductor material layer 10 during a front-end-of-line (FEOL) operation. For example, shallow trench isolation structures 12 may be formed in an upper portion of the semiconductor material layer 10 by forming shallow trenches and subsequently filling the shallow trenches with a dielectric material such as silicon oxide. Other suitable dielectric materials are within the contemplated scope of disclosure. Various doped wells (not expressly shown) may be formed in various regions of the upper portion of the semiconductor material layer 10 by performing masked ion implantation processes.

Gate structures 20 may be formed over the top surface of the substrate 8 by depositing and patterning a gate dielectric layer, a gate electrode layer, and a gate cap dielectric layer. Each gate structure 20 may include a vertical stack of a gate dielectric 22, a gate electrode 24, and a gate cap dielectric 28, which is herein referred to as a gate stack (22, 24, 28). Ion implantation processes may be performed to form extension implant regions, which may include source extension regions and drain extension regions. Dielectric gate spacers 26 may be formed around the gate stacks (22, 24, 28). Each assembly of a gate stack (22, 24, 28) and a dielectric gate spacer 26 may constitute a gate structure 20. Additional ion implantation processes may be performed that use the gate structures 20 as self-aligned implantation masks to form deep active regions.

Such deep active regions may include deep source regions and deep drain regions. Upper portions of the deep active regions may overlap with portions of the extension implantation regions. Each combination of an extension implantation region and a deep active region may constitute a source/drain region 14 depending on electrical biasing. A semiconductor channel 15 may be formed underneath each gate stack (22, 24, 28) between a neighboring pair of source/drain regions 14. Metal-semiconductor alloy regions 18 may be formed on the top surface of each source/drain region 14.

Field effect transistors may be formed on the semiconductor material layer 10. Each field effect transistor may include a gate structure 20, a semiconductor channel 15, a pair of source/drain regions 14 (one of which functions as a source region and another of which functions as a drain region), and optional metal-semiconductor alloy regions 18. CMOS circuits 75 may be provided on the semiconductor material layer 10, which may include a periphery circuit for the array(s) of transistors, such as thin film transistors (TFTs), and PCM switches to be subsequently formed.

In one embodiment, the substrate 8 may include a single crystalline silicon substrate, and the CMOS circuits 75 may include a respective portion of the single crystalline silicon substrate as a semiconducting channel. As used herein, a "semiconducting" element refers to an element having electrical conductivity in the range from $1.0\times10^{-6}$ S/cm to $1.0\times10^{5}$ S/cm. As used herein, a "semiconductor material" refers to a material having electrical conductivity in the range from $1.0\times10^{-6}$ S/cm to $1.0\times10^{5}$ S/cm in the absence of electrical dopants therein and is capable of producing a doped material having electrical conductivity in a range from 1.0 S/cm to $1.0\times10^{5}$ S/cm upon suitable doping with an electrical dopant.

Various interconnect-level structures may be subsequently formed, which are formed prior to formation additional memory devices and are herein referred to as lower interconnect-level structures (L0, L1, L2). In some embodiments, one or more additional devices may be formed over one or more levels of interconnect-level metal lines. For example, the one or more additional devices may include TFTs, memory devices, or PCM switches.

The lower interconnect-level structures (L0, L1, L2) may include a contact-level structure L0, a first interconnect-level structure L1, and a second interconnect-level structure L2. The contact-level structure L0 may include a planarization dielectric layer 31A including a planarizable dielectric material such as silicon oxide and various contact via structures 41V contacting a respective one of the source/drain regions 14 or the gate electrodes 24 and formed within the planarization dielectric layer 31A.

The first interconnect-level structure L1 may include a first interconnect level dielectric (ILD) layer 31B and first metal lines 41L formed within the first ILD layer 31B. The first ILD layer 31B is also referred to as a first line-level dielectric layer. The first metal lines 41L may contact a respective one of the contact via structures 41V. The second interconnect-level structure L2 may include a second ILD layer 32 and a stack of a first via-level dielectric material layer and a second line-level dielectric material layer or a line-and-via-level dielectric material layer. The second ILD layer 32 may include second interconnect-level metal interconnect structures (42V, 42L) there within, which includes first metal via structures 42V and second metal lines 42L. Top surfaces of the second metal lines 42L may be coplanar with the top surface of the second ILD layer 32.

FIG. 5B is a vertical cross-sectional view of a further structure during formation of a phase-change material switch, according to various embodiments. One or more PCM switches 95 (e.g., PCM switches 300*a*, 300*c*, 400*a*, 400*c*) may be formed in the switching region 50 over the second interconnect-level structure L2. A third ILD layer 33 may be formed during formation of one or more PCM switches 95. The set of all structures formed at the level of the one or more PCM switches 95 may be referred to as a third interconnect-level structure L3.

Figure 5C:
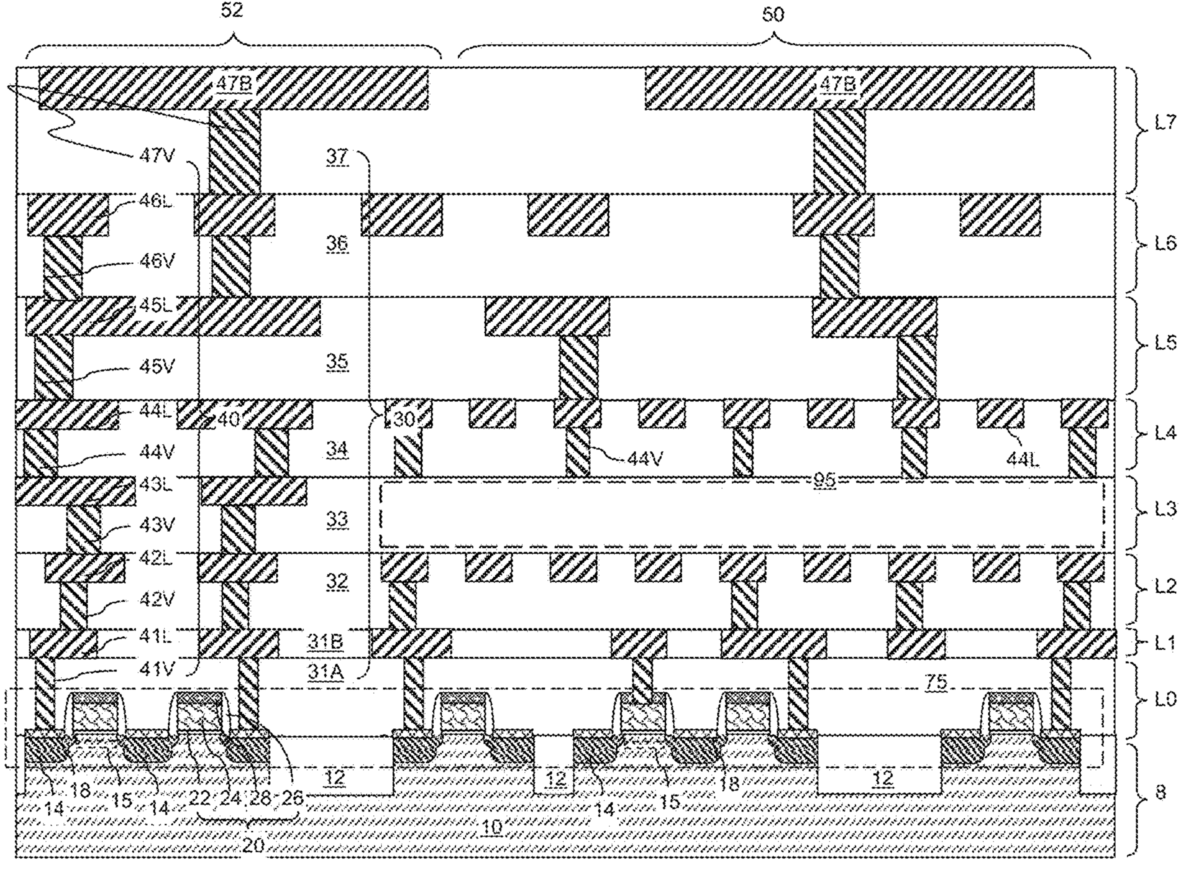
FIG. 5C is a vertical cross-sectional view of a further structure after formation of upper-level metal interconnect structures, according to various embodiments.

FIG. 5C is a vertical cross-sectional view of a further structure after formation of upper-level metal interconnect structures, according to various embodiments. Referring to FIG. 5C, third interconnect-level metal interconnect structures (43V, 43L) may be formed in the third ILD layer 33. The third interconnect-level metal interconnect structures (43V, 43L) may include second metal via structures 43V and third metal lines 43L. Additional interconnect-level structures may be subsequently formed, which are herein referred to as upper interconnect-level structures (L4, L5, L6, L7). For example, the upper interconnect-level structures (L4, L5, L6, L7) may include a fourth interconnect-level structure L4, a fifth interconnect-level structure L5, a sixth interconnect-level structure L6, and a seventh interconnect-level structure L7.

The fourth interconnect-level structure L4 may include a fourth ILD layer 34 having formed therein fourth interconnect-level metal interconnect structures (44V, 44L), which may include third metal via structures 44V and fourth metal lines 44L. The fifth interconnect-level structure L5 may include a fifth ILD layer 35 having formed therein fifth interconnect-level metal interconnect structures (45V, 45L), which may include fourth metal via structures 45V and fifth metal lines 45L. The sixth interconnect-level structure L6 may include a sixth ILD layer 36 having formed therein sixth interconnect-level metal interconnect structures (46V, 46L), which may include fifth metal via structures 46V and sixth metal lines 46L. The seventh interconnect-level structure L7 may include a seventh ILD layer 37 having formed therein sixth metal via structures 47V (which are seventh interconnect-level metal interconnect structures) and metal bonding pads 47B. The metal bonding pads 47B may be configured for solder bonding (which may employ C4 ball bonding or wire bonding) or may be configured for metal-to-metal bonding (such as copper-to-copper bonding).

Each ILD layer may be referred to as an ILD layer 30. Each of the ILD layers 30 may include a dielectric material such as undoped silicate glass, a doped silicate glass, organosilicate glass, amorphous fluorinated carbon, porous variants thereof, or combinations thereof. Other suitable dielectric materials are within the contemplated scope of disclosure. The ILD layers 30 may be deposited using any suitable deposition process, such a chemical vapor deposition (CVD), physical vapor deposition (PVD), atomic layer deposition (ALD), high density plasma CVD (HDPCVD), metalorganic CVD (MOCVD), plasma enhanced CVD (PECVD), sputtering, laser ablation, or the like.

Each of the interconnect-level metal interconnect structures may be referred to as an interconnect structure 40. Each contiguous combination of a metal via structure and an overlying metal line located within a same interconnect-level structure (L2-L7) may be formed sequentially as two distinct structures by employing two single damascene processes or may be simultaneously formed as a unitary structure employing a dual damascene process. Each of the interconnect structure 40 may include a respective metallic liner (such as a layer of TiN, TaN, WN, TiC, TaC, and WC having a thickness in a range from 2 nanometers (nm) to 20 nm) and a respective metallic fill material (such as W, Cu, Al, Co, Ru, Mo, Ta, Ti, other elemental metals, or an alloy or a combination thereof). Other suitable materials for use as a metallic liner and metallic fill material are within the contemplated scope of disclosure. Various etch stop dielectric layers and dielectric capping layers may be inserted between vertically neighboring pairs of ILD layers 30 or may be incorporated into one or more of the ILD layers 30.

While various embodiments may be described in which the one or more PCM switches 95 may be formed as a component of a third interconnect-level structure L3 (e.g., within the L3 interconnect-level dielectric), embodiments are expressly contemplated herein in which the one or more PCM switches 95 may be formed as components of any other interconnect-level structure (e.g., L1-L7). Further, while this example is described using an embodiment in which a set of eight interconnect-level structures are formed, embodiments are expressly contemplated herein in which a different number of interconnect-level structures is used.

In addition, embodiments are expressly contemplated herein in which two or more PCM switches 95 may be provided within multiple interconnect-level structures in the switching region 50. While an embodiment is disclosed in which one or more PCM switches 95 may be formed in a single interconnect-level dielectric layer (e.g., at L3), embodiments are expressly contemplated herein in which one or more additional PCM switches 95 may be formed over two vertically adjoining interconnect-level dielectric layers, as described in greater detail below with reference to FIG. 5D.

Figure 5D:
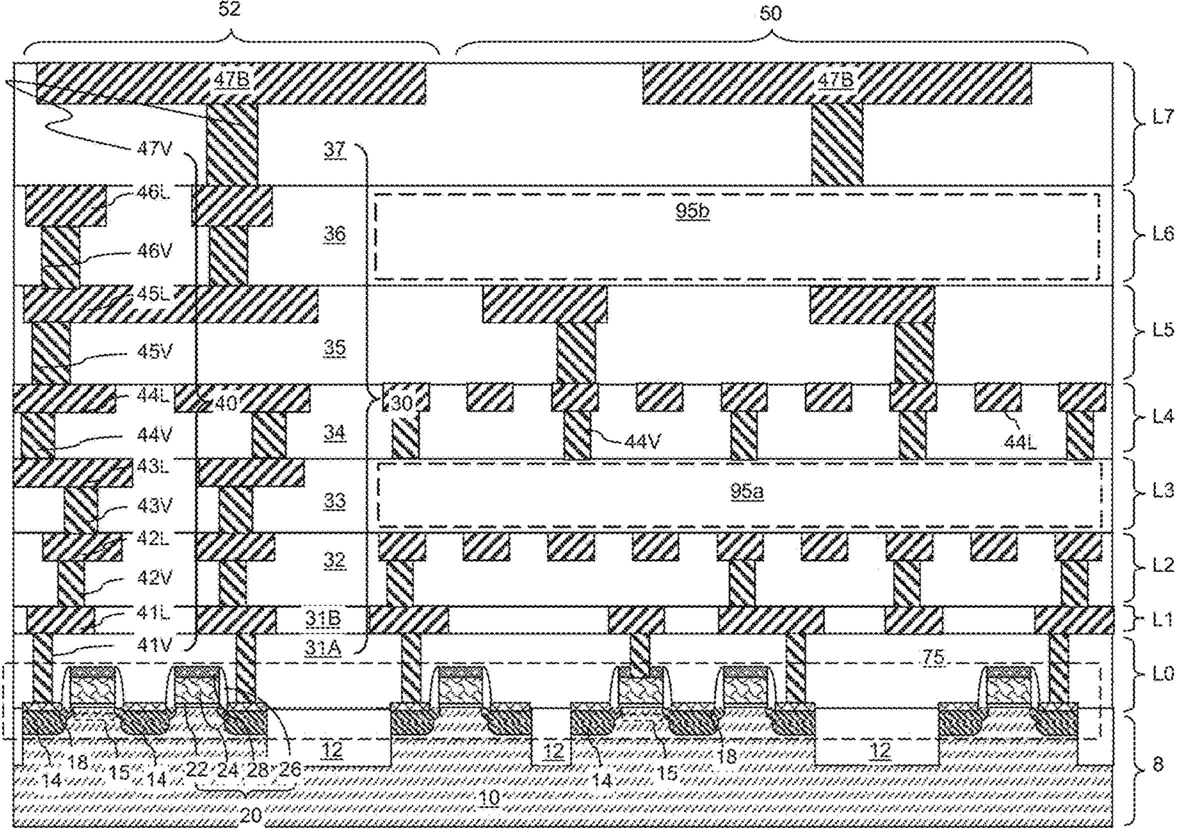
FIG. 5D is a vertical cross-sectional view of a further structure in which two phase-change material switches have been formed within two respective vertically adjoining interconnect-level dielectric layers, according to various embodiments.

FIG. 5D is a vertical cross-sectional view of a further structure in which two PCM switches (95*a*, 95*b*) have been formed over two respective vertically adjoining interconnect-level dielectric layers, according to various embodiments. In this example, a first one or more PCM switches 95*a* may be formed in the switching region 50 over the second interconnect-level structure L2 (e.g., within the L3 interconnect-level dielectric). The structure of FIG. 5D further includes one or more PCM switches 95*b* formed in the switching region 50 over the fifth interconnect-level structure L5 (e.g., within the L6 interconnect-level dielectric).

Figures 6A, 6B:
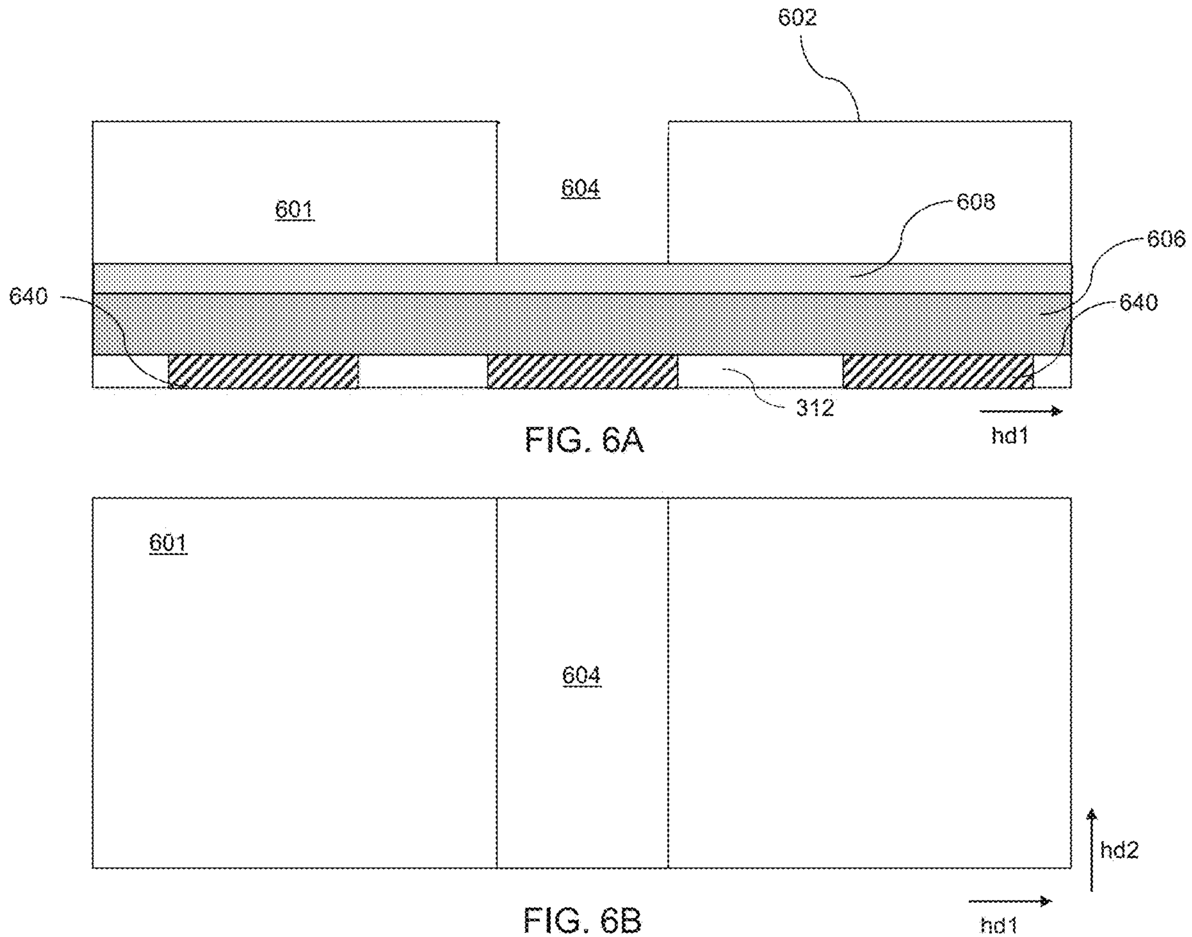
FIG. 6A is a vertical cross-sectional view of an intermediate structure during a process of forming a PCM switch illustrating a trench formed in a dielectric material layer, according to various embodiments.
FIG. 6B is a top view of the intermediate structure of FIG. 6A.

FIG. 6A is a vertical cross-sectional view of an intermediate structure during a process of forming a PCM switch, according to various embodiments. FIG. 6B is a top view of the exemplary intermediate structure of FIG. 6A. The intermediate structure may include a first switch dielectric material layer 312 and a heat spreader 640 formed within the first switch dielectric material layer 312 (e.g., see FIG. 6A). The heat spreader 640 may be formed using materials and processes similar to those used for forming electrical interconnect structures described above with reference to FIGS. 5A to 5D. As such, the heat spreader 640 may have a similar structure to an electrical interconnect but may be formed to be electrically isolated (i.e., floating) relative to electrical interconnects. In other embodiments, the heat spreader 640 may be formed of a material that is a good thermal conductor but that is electrically non-conductive. For example, the heat spreader 640 may include SiC.

As described above with reference to FIGS. 5A to 5D, the first switch dielectric material layer 312 may be an ILD layer 30 (e.g., see FIGS. 5C and 5D). The intermediate structure may further include a second switch dielectric material layer 601 formed over the first switch dielectric material layer 312 and the heat spreader 640). As shown, a first trench 604 may be formed in the second switch dielectric material layer 601. Alternative processes (see e.g., FIGS. 15-19 below) may be used to form the heater pad 314. For example, a blanket of heater pad material may be deposited and patterned. A dielectric material 601 may then be deposited around and/or over the patterned heater pad. The dielectric material 601 may then be polished back using, for example, a chemical mechanical polishing process.

In some embodiments, the intermediate structure of FIG. 6A may further include a first dielectric layer (e.g., a SiC layer 606 or a carbon-doped silicon layer 606) that is in contact with the heat spreader 640 and the first interconnect-level dielectric 312. The presence of the first dielectric layer may improve the thermal conductivity between the heat spreader 640 and the second switch dielectric material layer 601. Certain exemplary embodiments may further include a second dielectric layer (e.g., a silicon oxide layer 608 or silicon oxynitride layer 608), which may further improve the thermal conductivity between the heat spreader 640 and the second switch dielectric material layer 601. As shown in FIG. 6A, for example, some embodiments may include a SiC layer 606 formed over the heat spreader 640 and a silicon oxide layer 608 formed over the SiC layer 606. The SiC layer 606 may have a thermal conductivity that is greater than the silicon oxide layer 608 and the SiC layer 606 may have a thermal conductivity that is greater than the phase change material layer 306. The presence of the SiC layer 606 and the silicon oxide layer 608 may improve thermal conductivity between the heat spreader 640 and a heater pad 314 to be subsequently formed (e.g., see FIGS. 7A and 7B).

The SiC layer 606 may have a thickness in a range from 40 nm to 90 nm and the silicon oxide layer 608 may have a thickness in a range from approximately 30 nm to 90 nm. In some embodiments, the combined thickness of the SiC layer 606 and the silicon oxide layer 608 may be in a range from approximately 90 nm to approximately 180 nm. In other embodiments, the combined thickness of the SiC layer 606 and the silicon oxide layer 608 may be in a range from approximately 50 nm to approximately 200 nm. Thus, the heat spreader 640 may be spaced proximate to the heater pad 314 by a distance of about 50 nm to about 200 nm in order to operate as a heat spreader element.

The first trench 604 may be formed as follows. A patterned photoresist or hard mask (not shown) may be formed over a top surface of the second switch dielectric material layer 601. An anisotropic etch process, such as a reactive ion etch process, may then be performed to etch a portion of the second switch dielectric material layer 601 exposed through an opening in the patterned photoresist or hard mask. The etch process may be performed to remove a portion of the first switch dielectric material layer 312 to thereby expose a top surface of the silicon oxide layer 608. As shown in FIGS. 6A and 6B, the first trench 604 may have a rectangular cross-sectional shape in a plane extending along second horizontal direction hd2, including a horizontal bottom surface and vertically-extending sidewalls. However, it will be understood that the first trench 604 may have a different cross-sectional shape, such as a trapezoidal cross-section shape, and the sidewalls of the trench may include angled or curved surfaces. Following the etching process, the patterned photoresist or hard mask may be removed using a suitable process, such as via ashing or dissolution using a solvent.

Figures 7A, 7B:
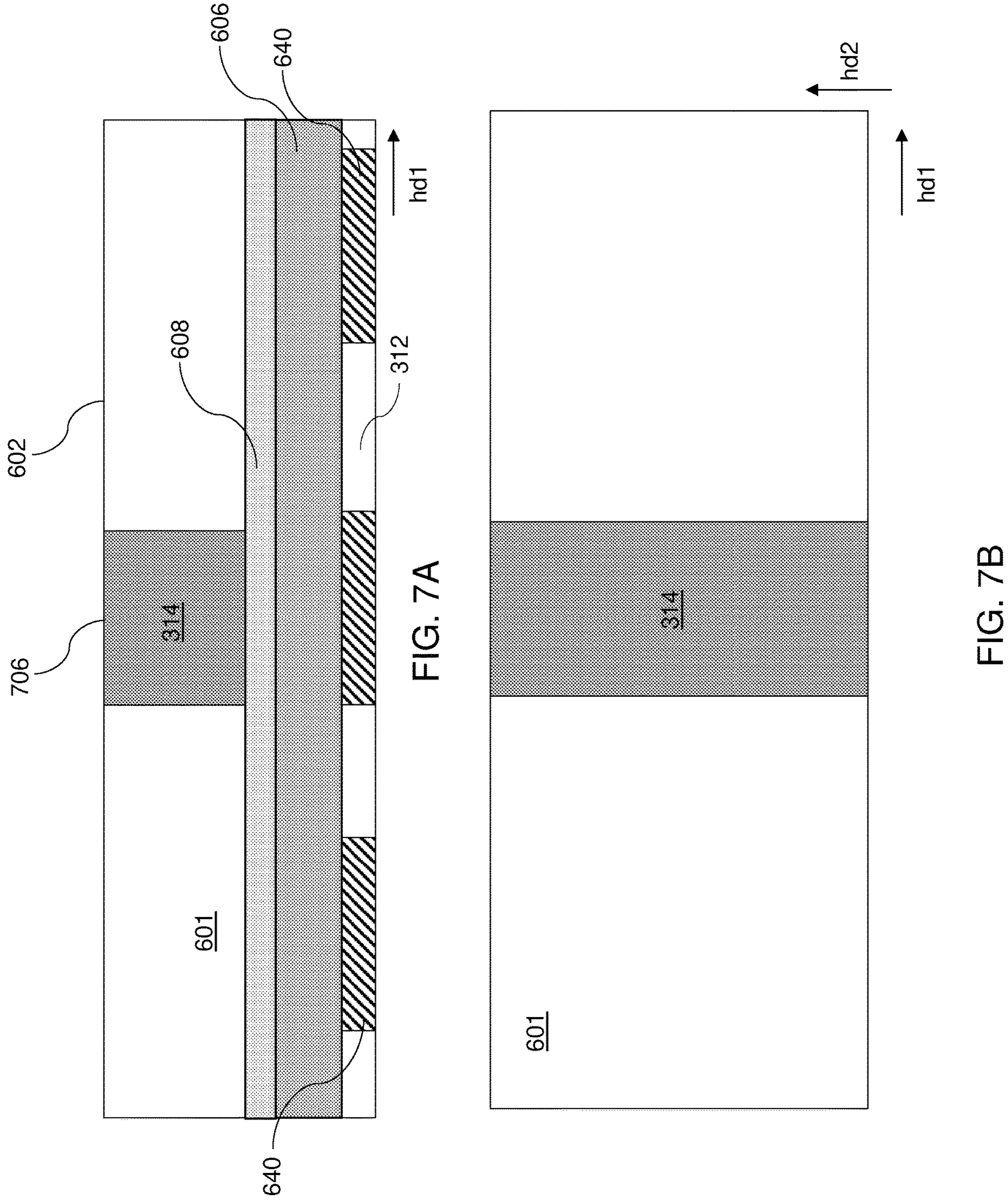
FIG. 7A is a vertical cross-sectional view of a further intermediate structure during a process of forming a PCM switch illustrating a heater pad embedded within the first switch dielectric material layer, according to various embodiments.
FIG. 7B is a top view of the intermediate structure of FIG. 7A.

FIG. 7A is a vertical cross-sectional view of an intermediate structure during a process of forming a PCM switch illustrating a heater pad 314 embedded within the second switch dielectric material layer 601, according to various embodiments. FIG. 7B is a top view of the exemplary intermediate structure of FIG. 7A. The exemplary intermediate structure of FIGS. 7A and 7B may be formed from the exemplary intermediate structure of FIGS. 6A and 6B by forming the heater pad 314 that may fill the first trench 604 in the second switch dielectric material layer 601. In this regard, a continuous heater material layer (not shown) may be formed over the upper surface 602 of the second switch dielectric material layer 601 and within the first trench 604 of FIGS. 6A and 6B, according to various embodiments. The continuous heater material layer may include a refractory metal, such as tungsten, a conductive metallic nitride material, such as tungsten nitride or titanium nitride, and/or a nickel silicide. Other suitable materials for the continuous heater material layer are within the contemplated scope of disclosure. The continuous heater material layer may be deposited using a suitable deposition process, such as PVD, sputtering, CVD, ALD, PECVD, electrochemical deposition, or combinations thereof.

A planarization process, such as a chemical mechanical planarization (CMP) process may then be performed to remove the continuous heater material layer from over the upper surface 602 of the second switch dielectric material layer 601 so that the upper surface 706 of the heater pad 314 and the upper surface 602 of the second switch dielectric material layer 601 are substantially co-planar. The second switch dielectric material layer 601 may contact lateral side surfaces of the heater pad 314, as shown in FIG. 7A. Further, the silicon oxide layer 608 may contact a bottom surface of the heater pad 314. Alternative processes (not shown) may be used to form the heater pad 314. For example, a blanket of heater pad material may be deposited and patterned. A dielectric material 601 may then be deposited around and/or over the patterned heater pad. The dielectric material 601 may then be polished back using, for example, a chemical mechanical polishing process.

Figure 8:
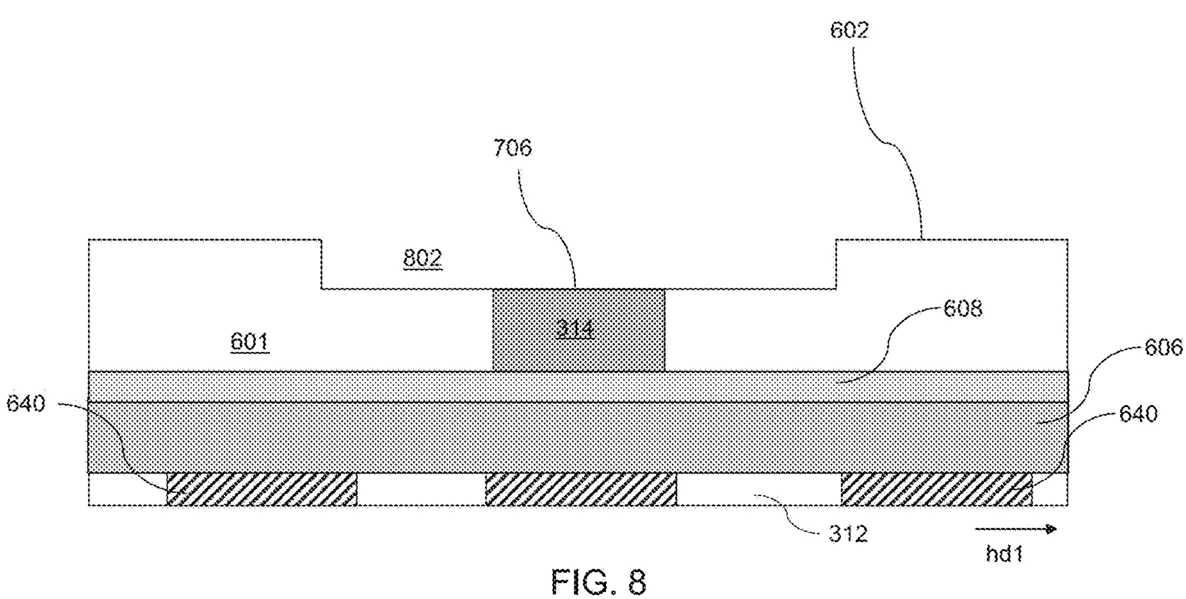
FIG. 8 is a vertical cross-sectional view of a further intermediate structure during a process of forming a PCM switch illustrating an upper surface of the heater pad vertically recessed with respect to the upper surface of the first switch dielectric material layer, according to various embodiments.

FIG. 8 is a vertical cross-sectional view of an intermediate structure during a process of forming a PCM switch illustrating the upper surface 706 of the heater pad 314 vertically recessed with respect to the upper surface 602 of the second switch dielectric material layer 601, according to various embodiments. Referring to FIG. 8, an etching process may be performed that may etch the material of the heater pad 314 along with a portion of the material of the second switch dielectric material layer 601 to thereby generate a second trench 802. For example, a masking material (not shown) may be deposited over the second switch dielectric material layer 601 such that the heater pad 314 and a portion of the second switch dielectric material layer 601 may be etched.

Following the etching process, the upper surface 706 of the heater pad 314 may be vertically recessed with respect to the upper surface 602 of the second switch dielectric material layer 601. In various embodiments, the upper surface 706 of the heater pad 314 may be vertically recessed with respect to the upper surface 602 of the second switch dielectric material layer 601 by at least about 20 nm, such as 20 nm to 100 nm, including from 30 nm to 60 nm, although lesser and greater recess distances may also be used. As shown, the second trench 802 may be wider than a width of the heater pad 314. As such, a dielectric capping layer 316 to be subsequently formed (e.g., see FIGS. 9A and 9B) may be wider than the width of the heater pad 314. In other embodiments, however, the dielectric capping layer 316 may be formed so to have a width that coincides with the width of the heater pad 314 (e.g., see FIGS. 3B, 3C, 4B, 4C, and 17-20B).

Figures 9A, 9B:
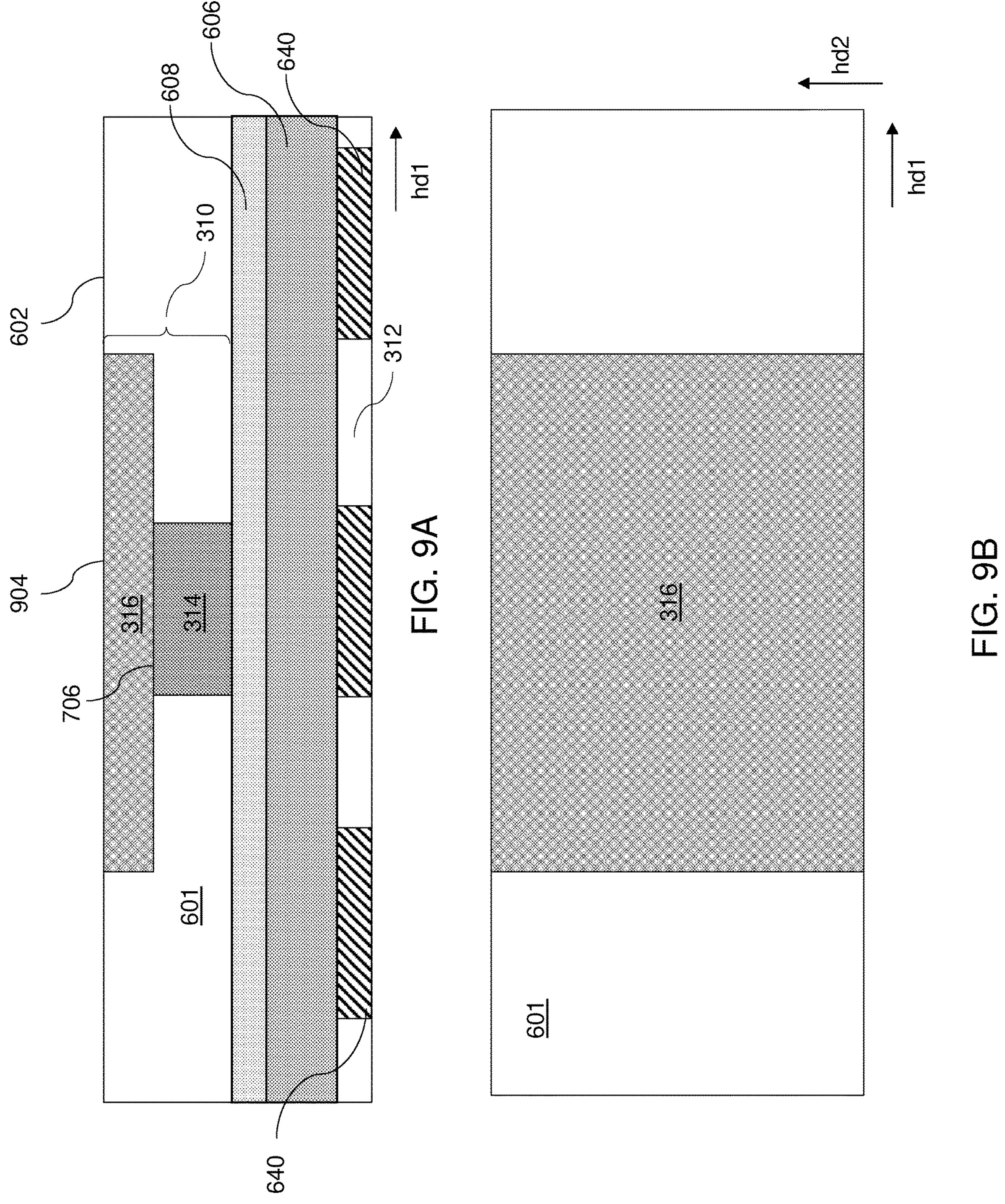
FIG. 9A is a vertical cross-sectional view of a further intermediate structure during a process of forming a PCM switch illustrating a dielectric capping layer over the heater pad, according to various embodiments.
FIG. 9B is a top view of the intermediate structure of FIG. 9A.

FIG. 9A is a vertical cross-sectional view of an exemplary intermediate structure during a process of forming a PCM switch illustrating a dielectric capping layer 316 formed over the heater pad 314, according to various embodiments. FIG. 9B is a top view of the exemplary intermediate structure of FIG. 9A. In this regard, a continuous dielectric capping layer (not shown) may be deposited over the upper surface 602 of the second switch dielectric material layer 601 and over the vertically-recessed upper surface 706 of the heater pad 314 within the second trench 802. A planarization process, such as a CMP process may be used to remove portions of the continuous dielectric capping layer from over the upper surface 602 of the second switch dielectric material layer 601 to generate the discrete dielectric capping layer 316.

The dielectric capping layer 316 may include a material having relatively high thermal conductivity and good electrical isolation characteristics, such as silicon nitride, silicon carbide, silicon carbide nitride, aluminum nitride, etc. Other suitable materials for the continuous dielectric material layer are within the contemplated scope of disclosure. The continuous dielectric capping layer may be deposited using a suitable deposition process as described above.

As shown in FIGS. 9A and 9B, for example, the dielectric capping layer 316 may have a strip-shape and may extend in a second horizontal direction hd2 over the upper surface 706 of the heater pad 314. The second switch dielectric material layer 601 may surround the dielectric capping layer 316 along lateral side surfaces of the second switch dielectric material layer 601. The upper surface 904 of the dielectric capping layer 316 may be coplanar with the upper surface 602 of the second switch dielectric material layer 601.

Further, as shown in FIGS. 9A and 9B, the dielectric capping layer 316 may be laterally confined along a first horizontal direction hd1 such that side surfaces of the dielectric capping layer 316 and side surfaces of the underlying heater pad 314 may form a first and second continuous surface extending along a second horizontal direction hd2. The first continuous surface and the second continuous surface may each contact the second switch dielectric material layer 601. In the embodiment shown in FIGS. 9A and 9B, the first continuous surface and the second continuous surface are each vertical surfaces, although it will be understood that the first continuous surface and the second continuous surface may be angled or curved surfaces that conform to the shape of the first trench 604 (see FIGS. 6A and 6B) previously formed in the second switch dielectric material layer 601. In other embodiments, the dielectric capping layer 316 may be optional. In other embodiments, the heater pad 314 may be in direct contact with a subsequently formed phase change material element 306.

Figure 10:
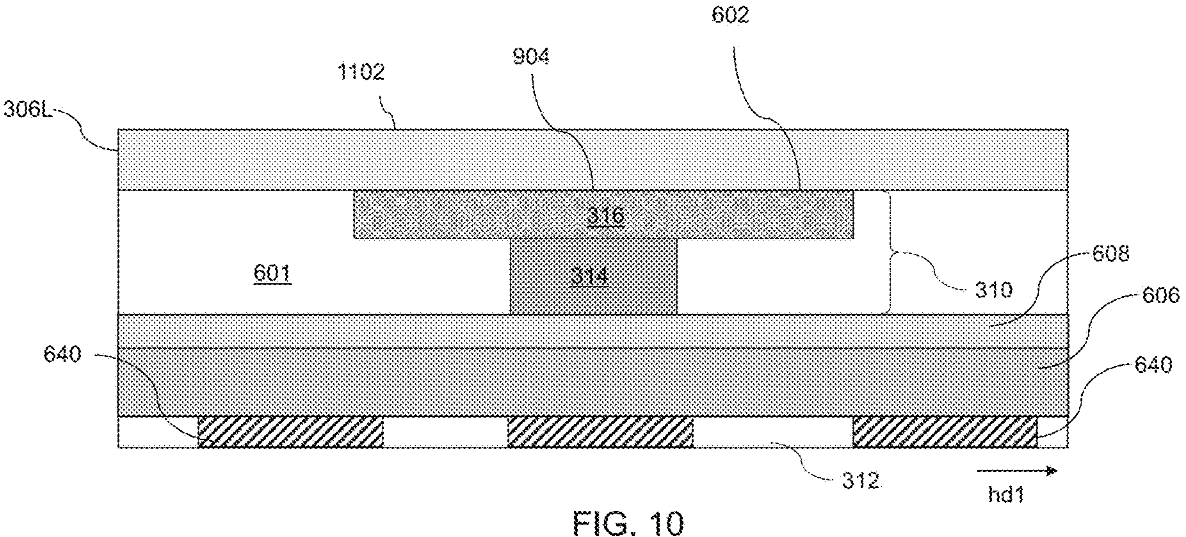
FIG. 10 is a vertical cross-sectional view of a further intermediate structure during a process of forming a PCM switch showing a continuous PCM layer formed over the upper surface of the first switch dielectric material layer and over the upper surface of the second dielectric material layer, according to various embodiments.

FIG. 10 is a vertical cross-sectional view of an intermediate structure during a process of forming a PCM switch showing a continuous phase change material (PCM) layer 306L formed over the upper surface 602 of the second switch dielectric material layer 601 and over the upper surface 904 of the dielectric capping layer 316, according to various embodiments. The continuous PCM layer 306L may be deposited over the upper surface of the second switch dielectric material layer 601 and over the upper surface 904 of the dielectric capping layer 316 using a suitable deposition process as described above. The continuous PCM layer 306L may include a suitable phase change material having at least two distinct phases providing different resistivity, such as a high resistivity amorphous phase and a low resistivity crystalline phase.

Suitable phase change materials for the continuous PCM layer 306L may include, without limitation, germanium telluride compounds, antimony telluride compounds, germanium antimony telluride (GST) compounds such as Ge2Sb2Te5 or GeSb2Te4, germanium antimony compounds, indium germanium telluride compounds, aluminum selenium telluride compounds, indium selenium telluride compounds, and/or aluminum indium selenium telluride compounds. In some embodiments, the phase change material may be doped using a suitable dopant, such as indium or antimony, or the phase change material may be undoped. Other suitable materials for the continuous PCM layer 306L are within the contemplated scope of disclosure.

Figures 11A, 11B:
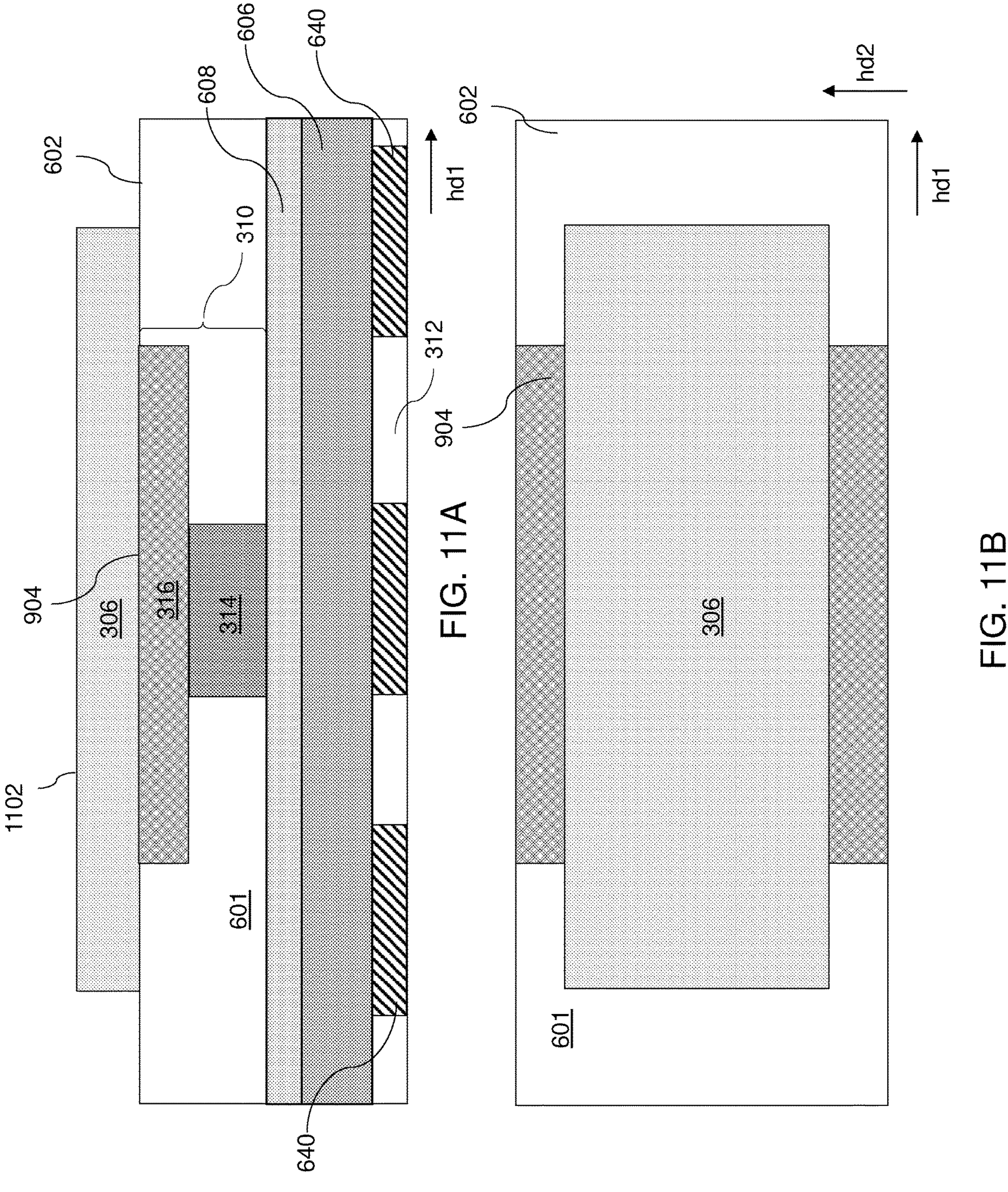
FIG. 11A is a vertical cross-sectional view of a further intermediate structure during a process of forming a PCM switch illustrating a discrete PCM layer over the upper surface of the first switch dielectric material layer and the upper surface of the dielectric capping layer, according to various embodiments.
FIG. 11B is a top view of the intermediate structure of FIG. 11A.

FIG. 11A is a vertical cross-sectional view of an intermediate structure during a process of forming a PCM switch illustrating a discrete phase change material element 306 over the upper surface 602 of the second switch dielectric material layer 601 and the upper surface 904 of the dielectric capping layer 316, according to various embodiments. FIG. 11B is a top view of the intermediate structure of FIG. 11A. The phase change material element 306 may be formed by performing an etching process, such as an anisotropic etching process, to remove portions of the continuous PCM layer 306L of FIG. 10. In this regard, a patterned mask (not shown) may be formed by depositing a layer of photoresist over the upper surface 1102 of the continuous PCM layer 306L, and lithographically patterning the photoresist to provide the patterned mask.

The patterned mask may cover a portion of the continuous PCM layer 306L overlying the dielectric capping layer 316 and the heater pad 314. The portion of the patterned mask overlying the dielectric capping layer 316 and the heater pad 314 may have a greater lateral dimension along a first horizontal direction hd1 than the dielectric capping layer 316 and the heater pad 314 along a first horizontal direction hd1 and may have a lesser lateral dimension than the dielectric capping layer 316 and the heater pad 314 along a second horizontal direction hd2 that is perpendicular to the first horizontal direction hd1.

The etching process may expose the upper surface 602 of the second switch dielectric material layer 601 and the upper surface 904 of the dielectric capping layer 316 surrounding the phase change material element 306 (e.g., see FIG. 11B). In various embodiments, the phase change material element 306 may have a greater lateral dimension along the first horizontal direction hd1 than the dielectric capping layer 316 and the heater pad 314 and may have a lesser lateral dimension than the dielectric capping layer 316 and the heater pad 314 along the second horizontal direction hd2 (e.g., see FIGS. 11A and 11B). Following the etching process, the patterned mask may be removed using a suitable process, such as via ashing or dissolution using a solvent.

Figures 12A, 12B:
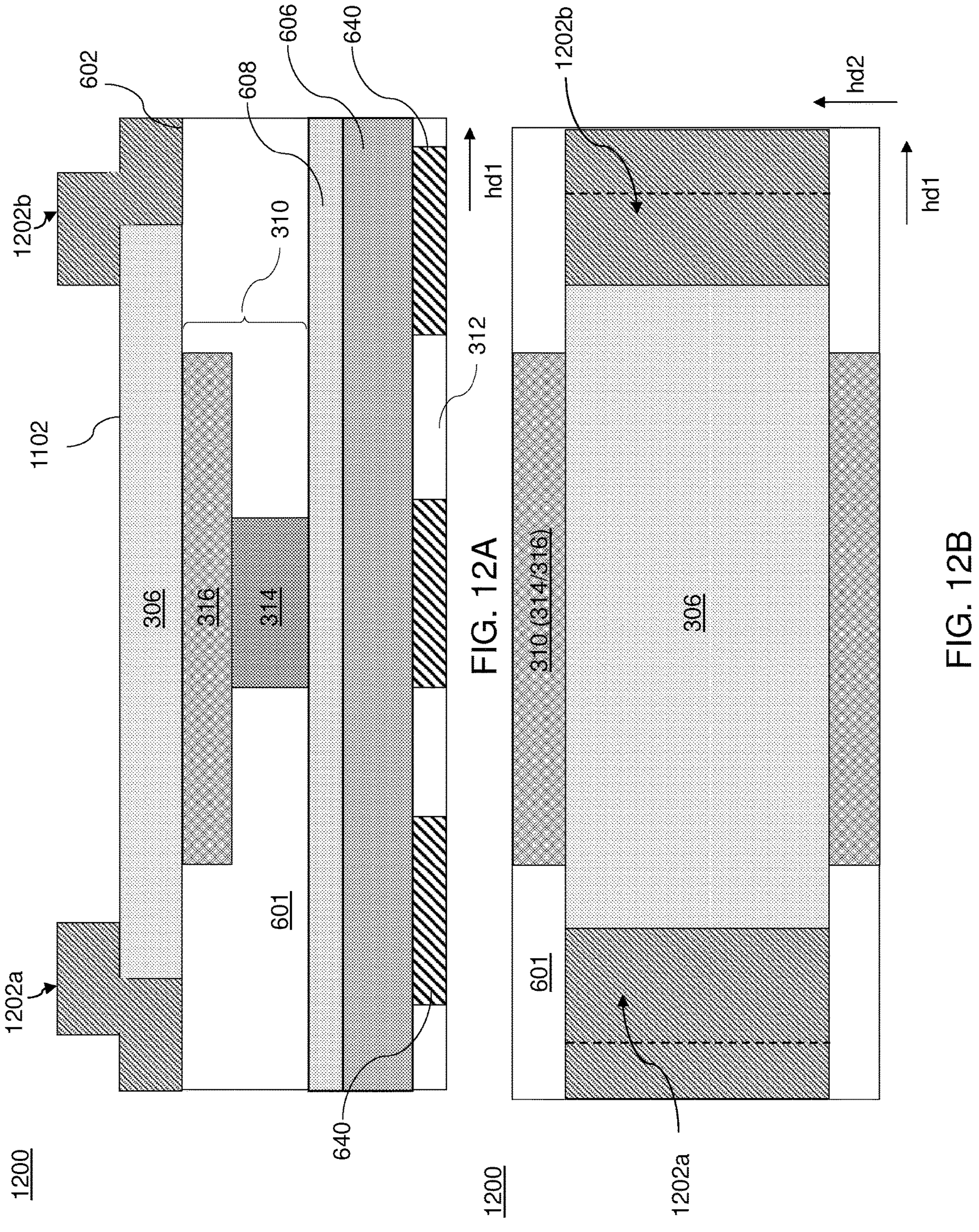
FIG. 12A is a vertical cross-sectional view of a PCM switch including first and second electrodes formed over the PCM layer.
FIG. 12B is a top view of the PCM switch of FIG. 12A.

FIG. 12A is a vertical cross-sectional view of a PCM switch 1200 including a first electrode 1202*a* and a second electrode 1202*b* formed over the upper surface 602 of the second switch dielectric material layer 601 and the upper surface 1102 and side surfaces of the phase change material element 306. FIG. 12B is a top view of the PCM switch 1200 of FIG. 12A. The PCM switch 1200 may be formed by deposition of a continuous electrode layer (not shown) followed by etching the continuous electrode layer to form the first electrode 1202*a* and a second electrode 1202*b*. In various embodiments, the first electrode 1202*a* and the second electrode 1202*b* may be electrically connected to the first RF conductor 304*a* and the second RF conductor, respectively (e.g., see FIGS. 3A and 4A).

The continuous electrode layer (not shown) may be formed by depositing an electrically conductive material over the exposed upper surfaces of the second switch dielectric material layer 601 and the dielectric capping layer 316 and over the upper surface and side surfaces of the phase change material element 306. The continuous electrode layer may include a metallic material having relatively low electrical resistivity, such as tungsten, tungsten nitride, nickel silicide, and/or aluminum. Other suitable materials for the continuous electrode layer are within the contemplated scope of disclosure. The continuous electrode layer may be deposited using a suitable deposition process as described above.

A patterned mask (not shown) may then be formed over the continuous electrode layer by depositing a layer of photoresist over the continuous electrode layer, and lithographically patterning the photoresist to provide the patterned mask. The patterned mask may expose a region of the continuous electrode layer that overlies the heater pad 314 and the dielectric capping layer 316 and may cover portions of the continuous electrode layer that overlie peripheral regions of the phase change material element 306 on opposite sides of the phase change material element 306.

An etching process, such as an anisotropic etching process, may then be performed to remove portions of the continuous electrode layer that are exposed through the patterned mask and to generate discrete the first electrode 1202*a* and the second electrode 1202*b* over the upper surface 602 of the second switch dielectric material layer 601 and the upper surface 1102 and side surfaces of the phase change material element 306. The etching process may expose a portion of the upper surface 1102 of the phase change material element 306 between the first electrode 1202*a* and the second electrode 1202*b*.

Figure 13:
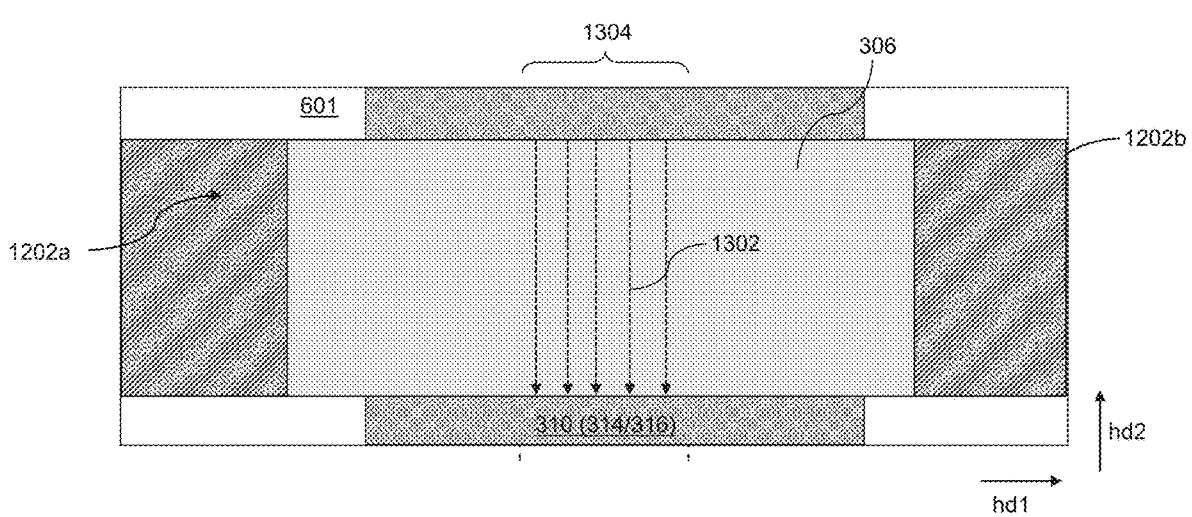
FIG. 13 is a top view of a PCM switch schematically illustrating a process of switching the PCM switch between different resistivity states, according to various embodiments.

FIG. 13 is a top view of the PCM switch 1200 schematically illustrating a process of switching the PCM switch 1200 between different resistivity states, according to various embodiments. Referring to FIG. 13, a bias voltage may be selectively applied across the heater pad 314 through electrical connections between the heating element 310 and the first heater pad 308*a* and the second heater pad 308*b* (e.g., see FIG. 3A). The application of the bias voltage across the heater pad 314 may induce a current to flow through the heater pad 314 and beneath the phase change material element 306, as schematically indicated by arrows 1302 in FIG. 13. The current flow through the heater pad 314 may cause the heater pad 314 to heat up via resistive heating. A portion of the thermal energy generated in the heater pad 314 may be transferred through the dielectric capping layer 316 to heat the phase change material element 306.

By controlling the characteristics of the current pulse flowing through the heater pad 314, the thermal profile within a portion 1304 (e.g., active heater region) of the phase change material element 306 overlying the heater pad 314 (which may also be referred to as the "active heater region" 1304 of the phase change material element 306) may be controlled. For example, a current pulse having a relatively short pulse width and rapid pulse falling time may quickly heat the active heater region 1304 of the phase change material element 306 above its melting temperature ($T_{melt}$), causing the active heater region 1304 of the phase change material element 306 to transition from a low-resistivity state to a high-resistivity state, while the rapid falling time of the current pulse may cause the active heater region 1304 of the phase change material element 306 to rapidly quench and avoid recrystallization as it cools. Thus, the active heater region 1304 of the phase change material element 306 may retain its high resistivity state indefinitely following the application of the current pulse.

In contrast, a current pulse having a relatively longer pulse width and longer falling time may heat the active heater region 1304 of the phase change material element 306 to a temperature above its crystallization temperature ($T_{crys}$), but below its melting temperature ($T_{melt}$), causing the active heater region 1304 of the phase change material element 306 to undergo crystal nucleation, while the long falling time of the current pulse may promote crystal growth in the active heater region 1304 of the phase change material element 306 as it gradually cools, thereby causing the active heater region 1304 of the phase change material element 306 to transition from a high-resistivity state to a low-resistivity state. The active heater region 1304 of the phase change material element 306 may retain this low resistivity state indefinitely until the application of a subsequent current pulse that is configured to transition the active heater region 1304 to a high-resistivity state.

In some embodiments, the first heater pad 308*a* and the second heater pad 308*b* that are connected to the heater pad 314 (e.g., see FIGS. 3A and 4A) may be electrically coupled to control circuitry configured to selectively control the application of current pulses through the heater pad 314 and thereby control (i.e., program) the resistance state of the active heater region 1304 of the phase change material element 306. For example, one or both of first heater pad 308*a* and the second heater pad 308*b* may be coupled to one or more CMOS transistors 75 via metal interconnect structures 40 as shown in FIGS. 5A-5D.

Figure 14:
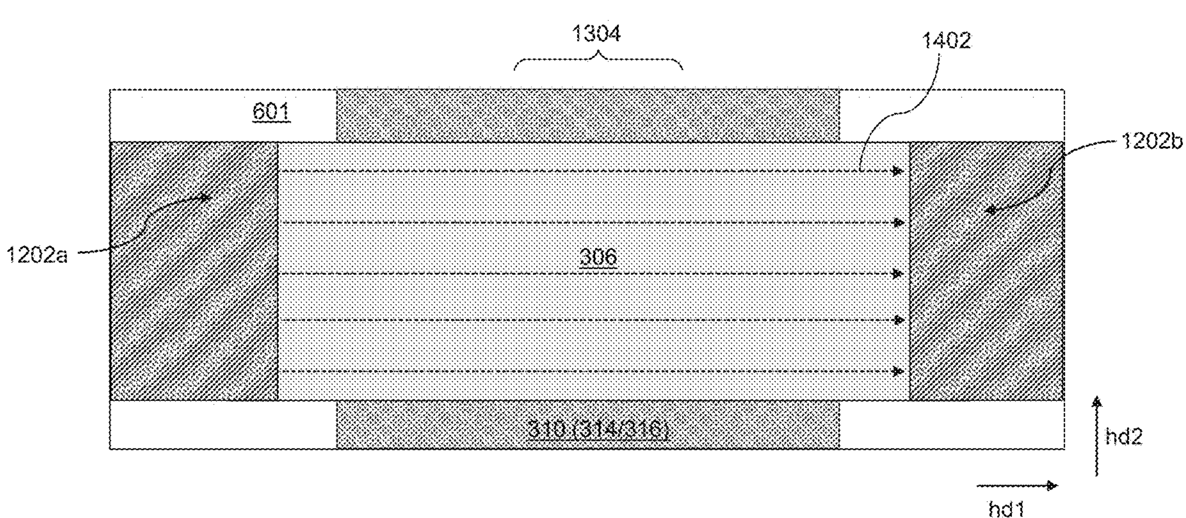
FIG. 14 is a top view of a PCM switch schematically illustrating a signal pathway across the PCM switch according to an embodiment of the present invention.

FIG. 14 is a top view of a PCM switch 1200 schematically illustrating a signal pathway across the PCM switch 1200 according to various embodiments. In this regard, an input signal, such as a radiofrequency (RF) signal, may be transmitted to the first electrode 1202*a* from the first RF conductor 304*a* (e.g., see FIGS. 3A and 4A). In instances in which the active heater region 1304 of the phase change material element 306 is in a low-resistivity state, the PCM switch 1200 is "On," (i.e., the PCM switch is closed) and the signal may be transmitted across the phase change material element 306 to the second electrode 1202*b* and to the second RF conductor 304*b* (e.g., see FIGS. 3A and 4A), as schematically indicated by arrows 1402. In instances in which the active heater region 1304 of the phase change material element 306 is in a high-resistivity state, the PCM switch 1200 is "Off" (i.e., the PCM switch is open) and the signal transmission to the second electrode 1202*b* and to the second RF conductor 304*b* may be blocked.

Figure 15:
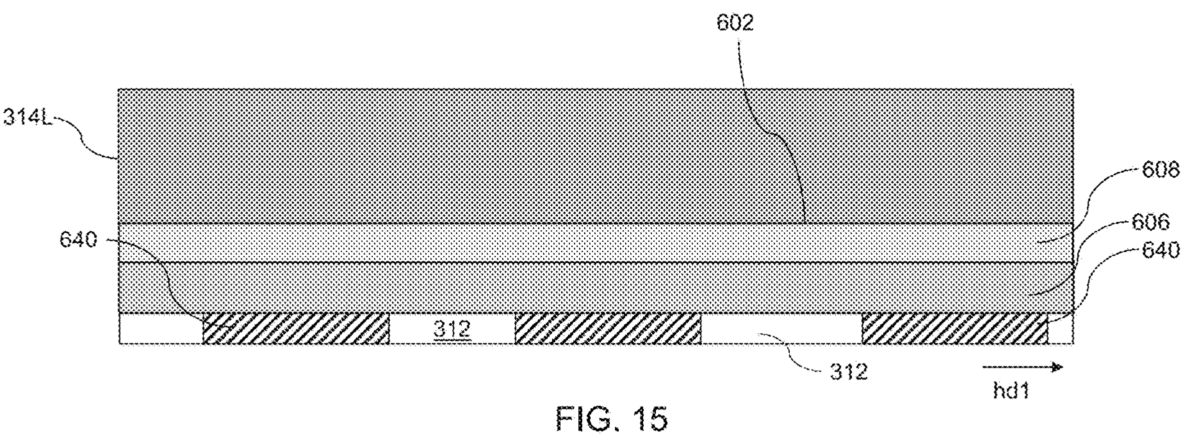
FIG. 15 is a vertical cross-sectional view of an intermediate structure during a process of forming a PCM switch illustrating a continuous heater material layer deposited over the upper surface of a lower dielectric material layer, according to various embodiments.
Figure 16:
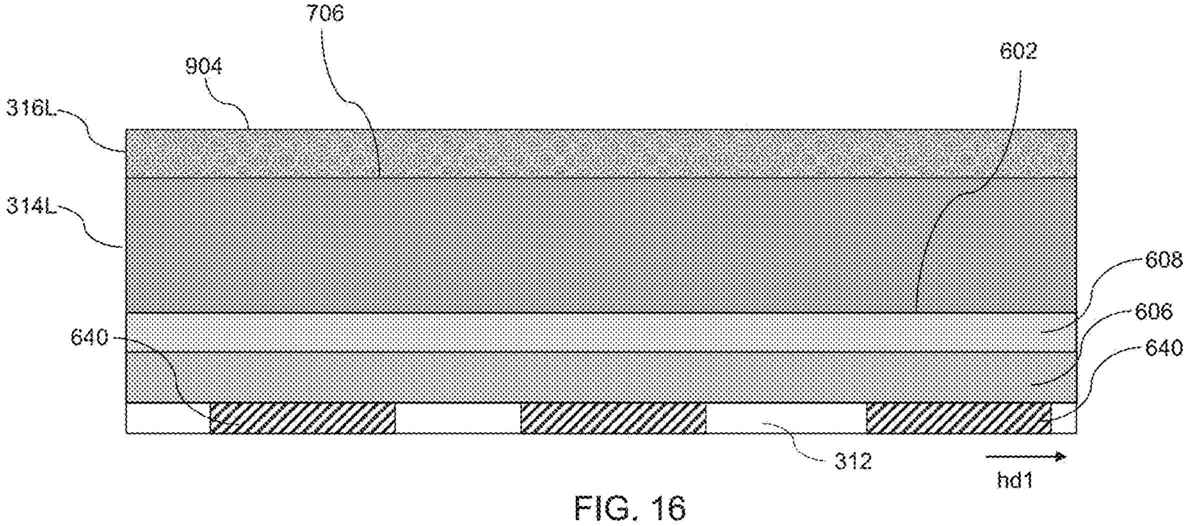
FIG. 16 is a vertical cross-sectional view of a further intermediate structure during a process of forming a PCM switch illustrating a continuous dielectric capping layer deposited over the upper surface of the continuous heater material layer, according to various embodiments.

FIGS. 15-19 are sequential vertical cross-sectional views of an intermediate structure during a process of forming an embodiment PCM switch illustrating an alternative process for forming a heater pad 314 and a laterally-confined dielectric capping layer 316 over the heater pad 314, according to various embodiments. Referring to FIG. 15, a continuous heater material layer 314L may be deposited over the upper surface 602 of the silicon oxide layer 608 formed over the SiC layer 606. As shown, the SiC layer 606 may be formed over the heat spreader 640 and the silicon oxide layer 608 may be formed over the SiC layer 606. Unlike in the intermediate structure shown in FIGS. 6A and 6B, however, the continuous heater material layer 314L may be deposited over a planar upper surface 602 of the silicon oxide layer 608 that does not include a trench (e.g., first trench 604 in FIGS. 6A and 6B) in the location of a PCM switch to be subsequently formed. In other embodiments, the SiC layer 606 and the silicon oxide layer 608 may be omitted. Referring to FIG. 16, an optional continuous dielectric capping layer 316L may be deposited over the upper surface 706 of the continuous heater material layer 314L.

Figure 17:
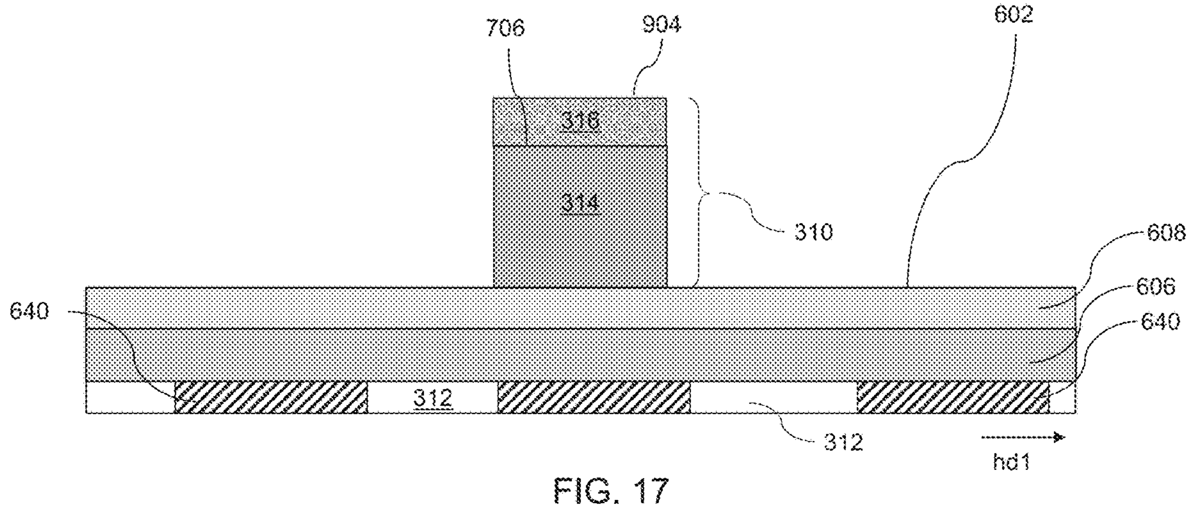
FIG. 17 is a vertical cross-sectional view of a further intermediate structure during a process of forming a PCM switch illustrating a heater pad formed over the upper surface of the lower dielectric material layer, and a dielectric capping layer over the upper surface of the of the heater pad, according to various embodiments.

FIG. 17 is a vertical cross-sectional view of an exemplary intermediate structure during a process of forming a PCM switch illustrating a heater pad 314 formed over the upper surface 602 of the silicon oxide layer 608, and a dielectric capping layer 316 over the upper surface 706 of the heater pad 314, according to various embodiments. In this regard, an etching process may be performed on the intermediate structure of FIG. 16 to generate the heater pad 314 and the dielectric capping layer 316 over the upper surface of the 706 of the heater pad 314, thereby forming the heating element 310. In this regard, a patterned mask (not shown) may be formed by depositing a layer of photoresist over the upper surface 904 of the continuous dielectric capping layer 316L (e.g., see FIG. 16), and lithographically patterning the photoresist to provide the patterned mask.

The patterned mask may cover a portion of the continuous dielectric capping layer 316L (e.g., see FIG. 16) corresponding to the location of a heater pad and discrete dielectric capping layer to be subsequently formed. An anisotropic etching process may be performed to etch unmasked portions of the continuous dielectric capping layer 316L and the continuous heater material layer 314L to provide a discrete heater pad 314 over the upper surface 602 of the second switch dielectric material layer 601, and a discrete dielectric capping layer 316 over the upper surface of the 706 of the heater pad 314. As shown, a side surface of the dielectric capping layer 316 and side surface of the underlying heater pad 314 may form a first continuous surface, and side surface of the dielectric capping layer 316 and side surface of the underlying heater pad 314 may form a second continuous surface. Following the etching process, the patterned mask may be removed using a suitable process, such as via ashing or dissolution using a solvent.

Figure 18:
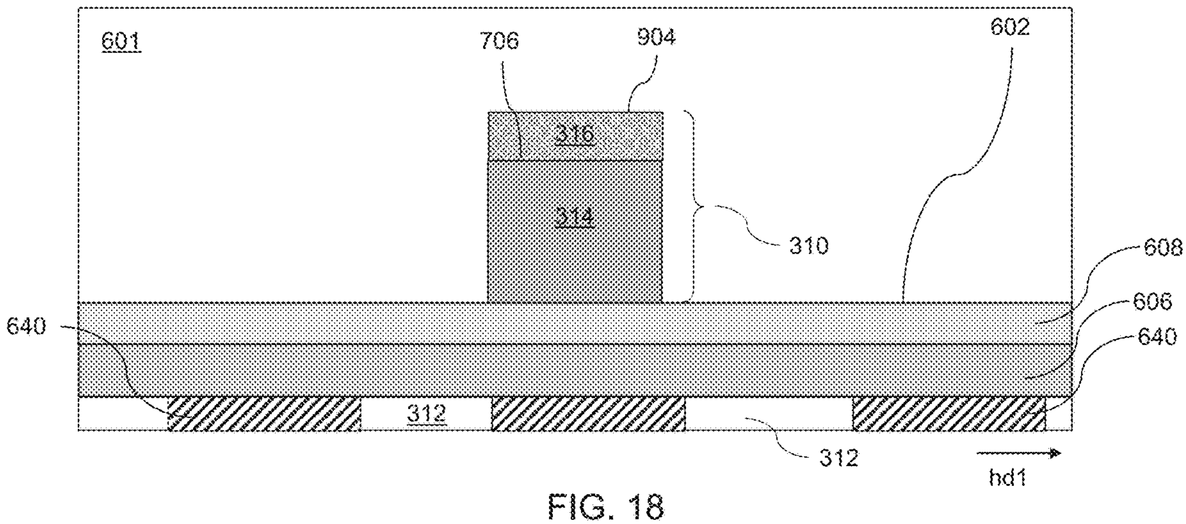
FIG. 18 is a vertical cross-sectional view of a further intermediate structure during a process of forming a PCM switch illustrating an upper dielectric material layer formed over the side surfaces of the heater pad, and over the upper surface and side surfaces of the dielectric capping layer, according to various embodiments.

FIG. 18 is a vertical cross-sectional view of an intermediate structure during a process of forming a PCM switch, illustrating a second switch dielectric material layer 601 formed over the upper surface 602 of the silicon oxide layer 608, over the side surfaces of the heater pad 314, and over the upper surface 904 and side surfaces and of the dielectric capping layer 316, according to various embodiments. Referring to FIG. 18, the second switch dielectric material layer 601 may include a suitable dielectric material and may be deposited using a suitable deposition process as described above. In some embodiments, the second switch dielectric material layer 601 may have the same composition as the first switch dielectric material layer 312. Alternatively, the second switch dielectric material layer 601 may have a different composition than the first switch dielectric material layer 312.

Figure 19:
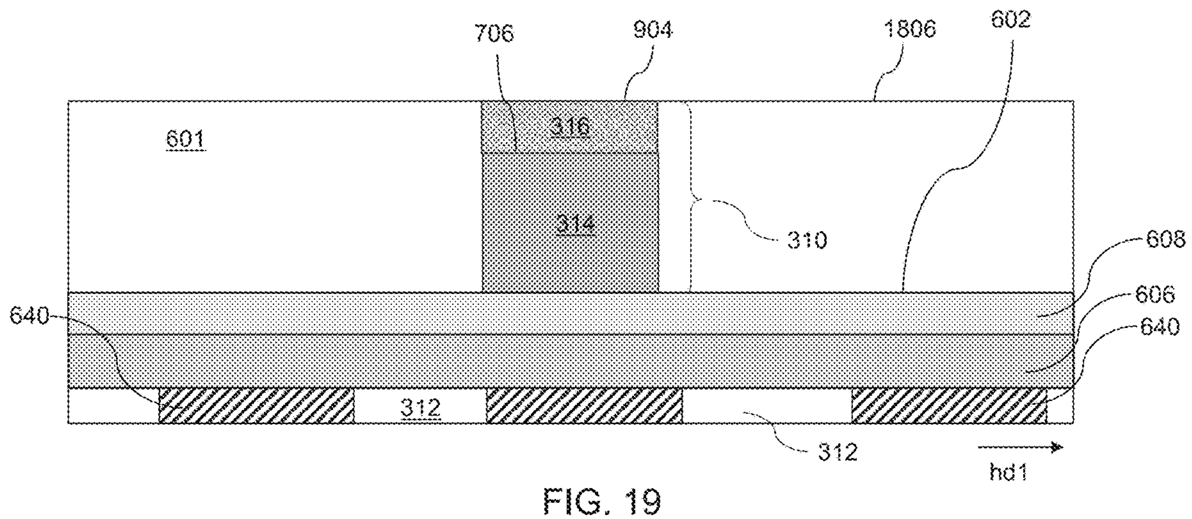
FIG. 19 is a vertical cross-sectional view of a further intermediate structure during a process of forming a PCM switch following a planarization process that removes a portion of the upper dielectric material layer from over the upper surface of the dielectric capping layer, according to various embodiments.

FIG. 19 is a vertical cross-sectional view of an intermediate structure during a process of forming a PCM switch following a planarization process that may remove a portion of the second switch dielectric material layer 601 from over the upper surface 904 of the dielectric capping layer 316, according to various embodiments. Referring to FIG. 19, a planarization process, such as a CMP process may be used to remove a portion of the second switch dielectric material layer 601 from over the upper surface 904 of the dielectric capping layer 316. Following the planarization process, an upper surface 1806 of the second switch dielectric material layer 601 may be co-planar with the upper surface 904 of the dielectric capping layer 316. The silicon oxide layer 608 may contact the lower surface of the heater pad 314 and the second switch dielectric material layer 601 may laterally surround the heater pad 314 and the dielectric capping layer 316. The processing steps described above with reference to FIGS. 10 to 12B may then be performed to form a PCM switch 1200 in accordance with an embodiment of the present disclosure.

Figure 20A:
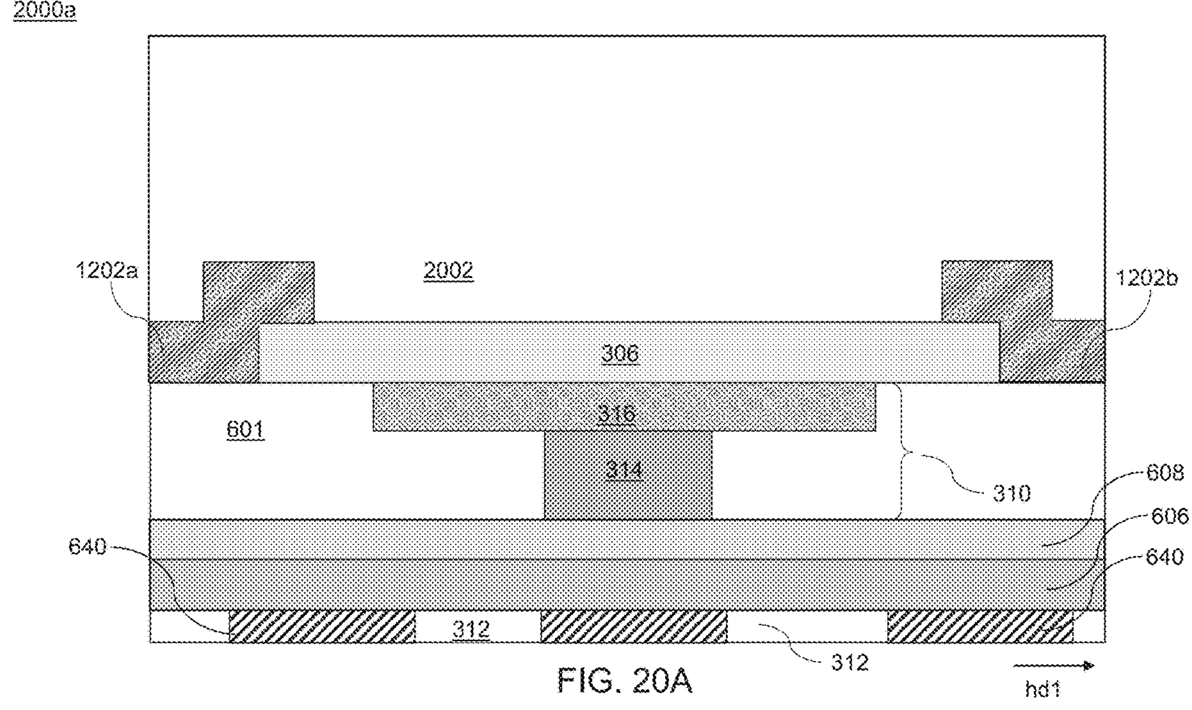
FIG. 20A is a vertical cross-sectional view of a PCM switch, according to various embodiments.

FIG. 20A is a vertical cross-sectional view of a PCM switch 2000*a*, according to various embodiments. The PCM switch 2000*a* of FIG. 20A may be formed by depositing a third switch dielectric material layer 2002 over the PCM switch 1200 of FIGS. 12A and 12B. In this regard, processing operations described above with reference to FIGS. 10 to 12B may be performed to form the phase change material element 306 and the first electrode 1202*a* and the second electrode 1202*b* over a starting structure (e.g., see FIGS. 9A, 9B, and 19). After deposition of the third switch dielectric material layer 2002, a planarization process (e.g., CMP) may then be performed to generate a planar top surface to the third switch dielectric material layer 2002.

In this embodiment, the heat spreader 640 may be configured to remove heat from (i.e., quench) the PCM element during a cool-down phase after a switching event (e.g., switching from insulating to conducting or from conducting to insulating), as described above. In further embodiments, one or more dielectric layers 30 and interconnect structures 40 may be formed over the PCM switch 2000, as described in greater detail with reference to FIGS. 5A to 5D, above, and further described with reference to FIG. 26, below. Various materials used for the heat spreader 640 may have a thermal conductivity in a range from approximately 200 W/mK to approximately 1,000 W/mK. For example, a heat spreader 640 made of copper may have a thermal conductivity that is approximately 400 W/mK. In other embodiments, the heat spreader 640 may be made of a material that is a good thermal conductor but that is electrically non-conducting. For example, the heat spreader 640 may include SiC, which has a thermal conductivity that is approximately 120 W/mK.

Figure 20B:
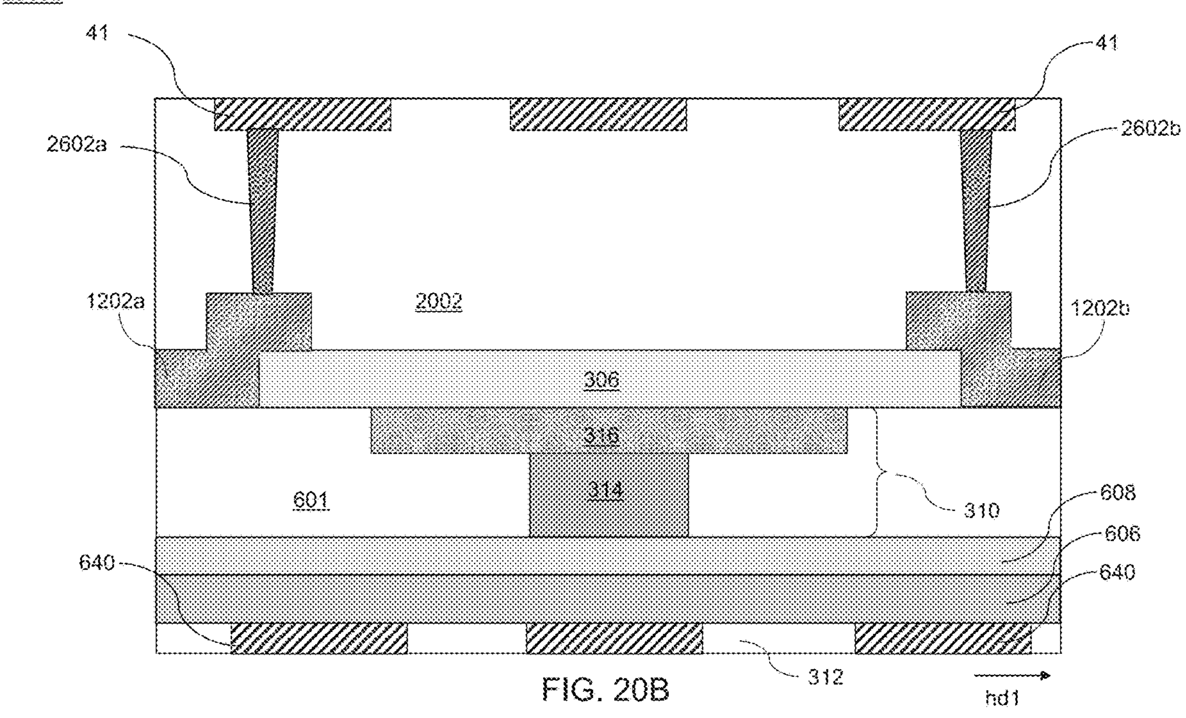
FIG. 20B is a vertical cross-sectional view of a further PCM switch, according to various embodiments.

FIG. 20B is a vertical cross-sectional view of a further PCM switch 2000*b*, according to various embodiments. The PCM switch 2000*b* may be formed from the PCM switch 2000*a* of FIG. 20A by patterning and etching the third switch dielectric material layer 2002 to form vias that may be filled with a conductive material to form a first interconnect via 2602*a*, connected to the first electrode 1202*a*, and a second interconnect via 2602*b*, connected to the second electrode 1202*b*. The third switch dielectric material layer 2002 may be further patterned, etched, and filled with a conductive material to form an interconnect line 41.

As described above with reference to FIGS. 5A to 5D, the interconnect line 41, the first interconnect via 2602*a*, and the second interconnect via 2602*b* may be formed in separate damascene processes or in a single dual damascene process. As such, the first electrode 1202*a*, the second electrode 1202*b*, the phase change material element 306, and the heating element 310 may form an RF switch that blocks RF signals when the phase change material element 306 is in the electrically insulating phase and conducts RF signals between the first electrode 1202*a* and the second electrode 1202*b* when the when the phase change material element 306 is in the electrically conducting phase. The heat spreader 640 may be proximate to the heating element 310 and the interconnect structure (41, 2602*a*, 2602*b*) may be proximate to the phase change material element 306 as shown, for example, in FIG. 20B. As such, the heat spreader 640 may act as a heat spreader for the heating element 310 and may remove heat from the heating element 310.

Figure 21:
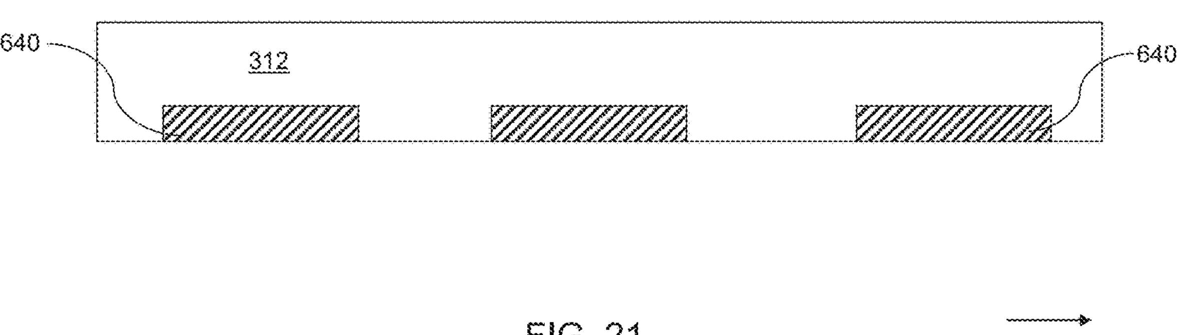
FIG. 21 is a vertical cross-sectional view of an intermediate structure that may be used in the formation of a PCM switch, according to various embodiments.
Figure 23:
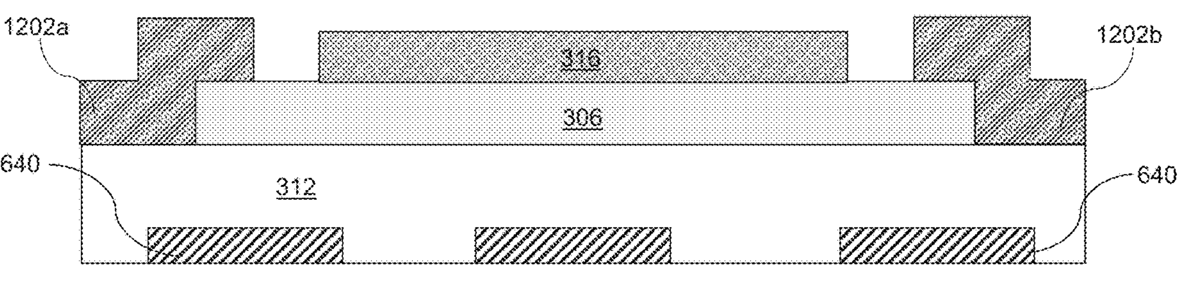
FIG. 23 is a vertical cross-sectional view of a further intermediate structure that may be used in the formation of a PCM switch, according to various embodiments.
Figure 24:
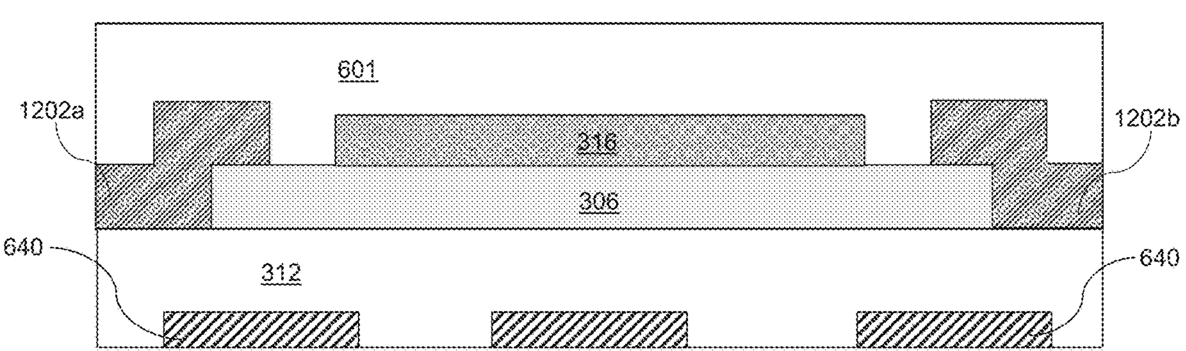
FIG. 24 is a vertical cross-sectional view of a further intermediate structure that may be used in the formation of a PCM switch, according to various embodiments.
Figure 25:
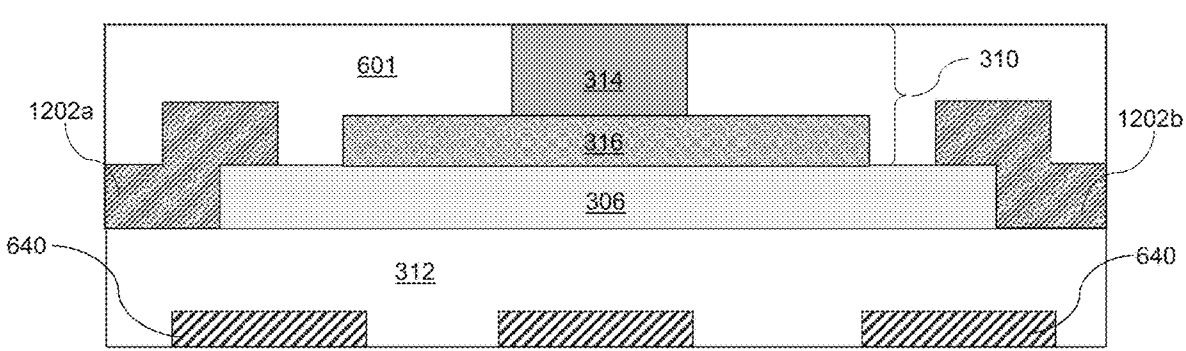
FIG. 25 is a vertical cross-sectional view of a PCM switch, according to various embodiments.
Figure 26:
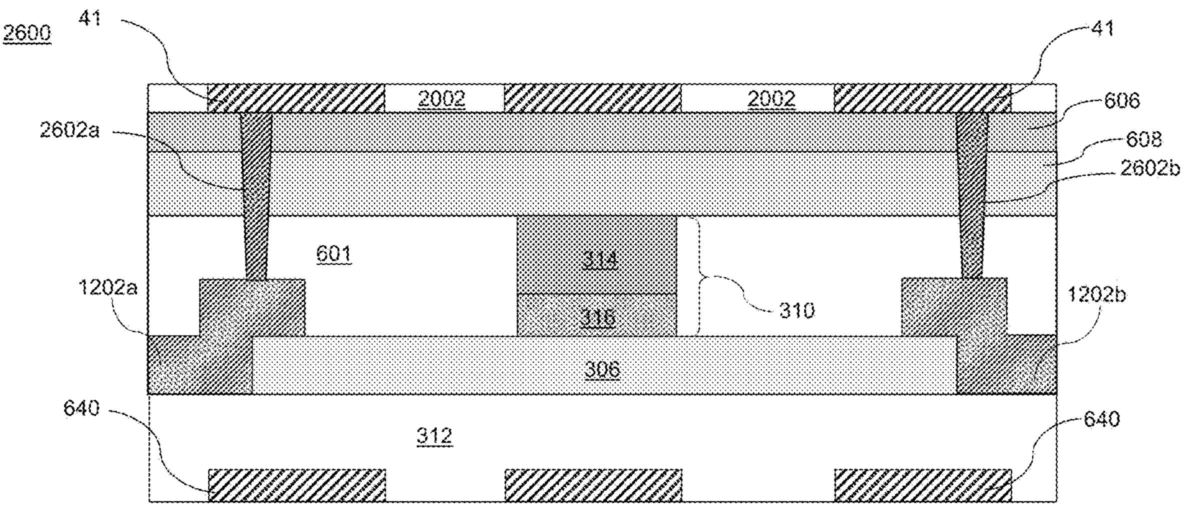
FIG. 26 is a vertical cross-sectional view of a further PCM switch, according to various embodiments.

FIGS. 21 to 24 are vertical cross-sectional views of intermediate structures 2100, 2200, 2300, and 2400, respectively, which may be used in the formation of further PCM switches 2500 and 2600, as shown in FIGS. 25 and 26, according to various embodiments. As shown in FIG. 21, a heat spreader 640 may be formed within a first switch dielectric material layer 312 and a top surface of the first switch dielectric material layer 312 may be planarized. As described above, the heat spreader 640 may be formed using materials and processes similar to those used to form interconnect structures as described above with reference to FIGS. 5A to 5D. As such, the heat spreader 640 may have a shape similar to that of an electrical interconnect and may be formed of similar materials. Unlike an electrical interconnect, however, the heat spreader 640 may be electrically isolated (e.g., electrically floating) from electrical interconnects. A phase change material element 306 may then be formed over the first switch dielectric material layer 312 as shown, for example, in FIG. 22. The phase change material element 306 may be formed over the first switch dielectric material layer 312 using processes similar to those described with reference to FIGS. 10 to 11B, above.

As shown in FIG. 23, the first electrode 1202*a* and the second electrode 1202*b* may then be formed over the second switch dielectric material layer 601 using processes similar to those described above with reference to FIGS. 12A and 12B. A capping layer 316 may also be formed over the phase change material element 306. Referring to FIG. 24, a second switch dielectric material layer 601 may then be deposited over the phase change material element 306, the first electrode 1202*a*, the capping layer 316, the second electrode 1202*b*. A planarization process may then be performed to provide a planar surface of the second switch dielectric material layer 601. Referring to FIG. 25, the heater pad 314 may then be formed over the PCM element using processes similar to those described above with reference to FIGS. 7A to 8. As described above, the heater pad 314 and the capping layer 316 may together form the heating element 310. The resulting structure is the further embodiment PCM switch 2500, as shown in FIG. 25.

FIG. 26 is a vertical cross-sectional view of a further PCM switch 2600, according to various embodiments. The PCM switch 2600 may be formed from the PCM switch 2500 of FIG. 25 by forming a first dielectric layer (e.g., the silicon oxide layer 608) and a second dielectric layer (e.g., the SiC layer 606) over the PCM switch 2500 of FIG. 25. A planarization process (e.g., CMP) may then be performed to form a planar top surface of the SiC layer 606. The SiC layer 606, the silicon oxide layer 608, and the second switch dielectric material layer 601 may then be patterned and etched to form vias that may be filled with a conductive material to form a first interconnect via 2602*a*, connected to the first electrode 1202*a*, and a second interconnect via 2602*b*, connected to the second electrode 1202*b*. A third switch dielectric material layer 2002 may then be formed over the SiC layer and over the first interconnect via 2602*a* and the second interconnect via 2602*b*. The third switch dielectric material layer 2002 may be further patterned, etched, and filled with a conductive material to form an interconnect line 41. Additional dielectric layers 30 and interconnect structures 40 may then be formed over the PCM switch 2600 of FIG. 26. As described above with reference to FIGS. 5A to 5D, the interconnect line 41, the first interconnect via 2602*a*, and the second interconnect via 2602*b*, may be formed in separate damascene processes or in a single dual damascene process.

The first electrode 1202*a*, the second electrode 1202*b*, the phase change material element 306, and the heating element 310, may form an RF switch that blocks RF signals when the phase change material element 306 is in the electrically insulating phase and conducts RF signals between the first electrode 1202*a* and the second electrode 1202*b* when the when the phase change material element 306 is in the electrically conducting phase. Further, the heat spreader 640 may be configured to remove heat from one or both of the phase change material element 306 and the heating element 310. For example, the heat spreader 640 may be proximate to the phase change material element 306 and the interconnect structure (41, 2602*a*, 2602*b*) may be proximate to the heating element 310 as shown, for example, in FIG. 26. (e.g., of FIGS. 25 and 26).

Figure 27A:
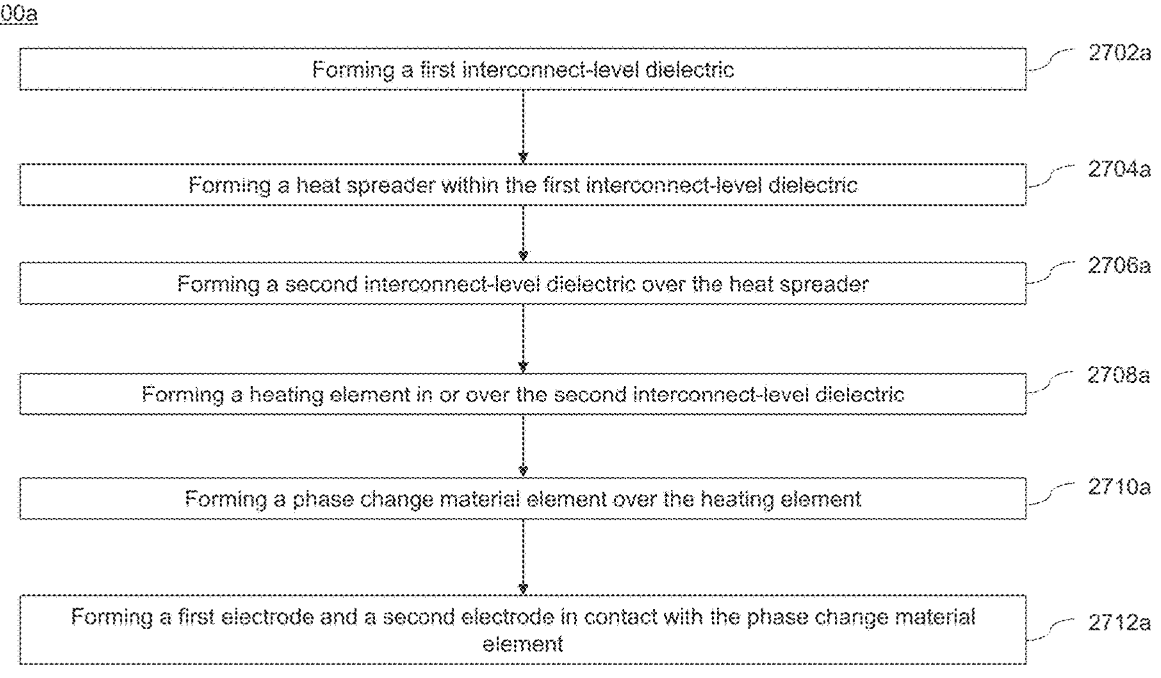
FIG. 27A is a flowchart illustrating operations of an embodiment method of fabricating a PCM switch, according to various embodiments.

FIG. 27A is a flowchart illustrating operations of an embodiment method 2700*a* of fabricating a PCM switch 1200 (e.g., see FIGS. 12A, 12B, 20A, and 20B), according to various embodiments. In operation 2702*a*, the method 2700*a* may include forming a first interconnect-level dielectric (e.g., first switch dielectric material layer 312). In operation 2704*a*, the method 2700*a* may include forming a heat spreader 640 (e.g., see FIGS. 5A to 6A) within the first interconnect-level dielectric 312. In operation 2706*b*, the method 2700*a* may include forming a second interconnect-level dielectric (e.g., second switch dielectric material layer 601) over the heat spreader 640 (e.g., see FIGS. 5A to 6A) and first interconnect-level dielectric 312. In operation 2708*a*, the method 2700*a* may further include forming a heating element 310 (e.g., see FIGS. 9A, 9B, and 17) over the second interconnect-level dielectric 601.

Figure 22:
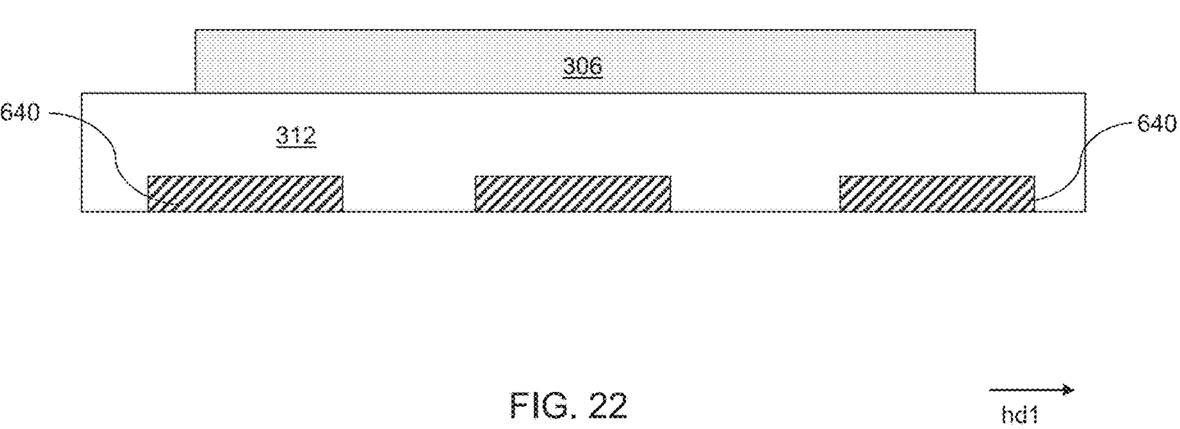
FIG. 22 is a vertical cross-sectional view of a further intermediate structure that may be used in the formation of a PCM switch, according to various embodiments.

In operation 2710*a*, the method 2700*a* may further include forming a phase change material element 306 over the heating element 310 (e.g., see FIGS. 11A, 11B, and 22). In operation 2712*a*, the method 2700*a* may further include forming a first electrode 1202*a* and a second electrode 1202*b* in contact with the phase change material element 306 (e.g., see FIGS. 12A, 12B, and 20). In some embodiments, the method 2700*a* may further include forming a first dielectric layer (e.g. a carbon-doped silicon layer or SiC layer 606) that is in contact with the heat spreader 640 such that the first dielectric layer separates the heat spreader 640 from the heating element 310 (e.g., see FIGS. 12A, 12B, and 20). The method 2700*a* may further include forming a second dielectric layer (e.g., a silicon oxide layer 608) that separates the heat spreader 640 from the heating element 310 (e.g., see FIGS. 12A, 12B, and 20).

Figure 27B:
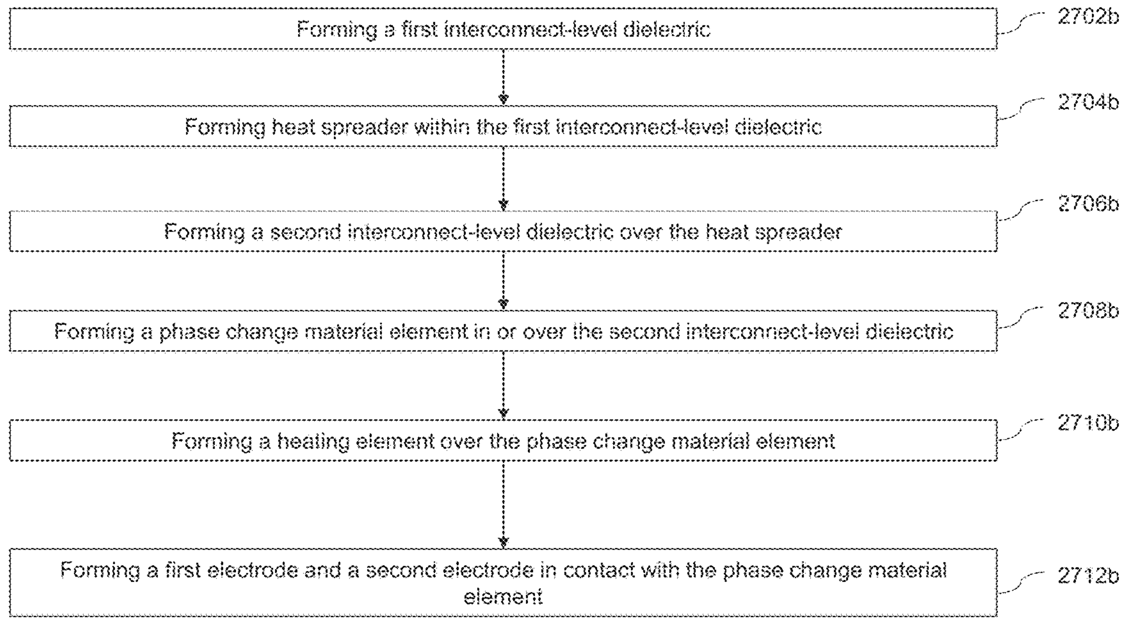
FIG. 27B is a flowchart illustrating operations of a further embodiment method of fabricating a PCM switch, according to various embodiments.

FIG. 27B is a flowchart illustrating operations of an embodiment method 2700*b* of fabricating a PCM switch (2500, 2600*a*, 2600*b*) (e.g., see FIGS. 25, 26A, and 26B), according to various embodiments. In operation 2702*b*, the method 2700*b* may include forming a first interconnect-level dielectric 312. In operation 2704*b*, the method 2700*b* may include forming a heat spreader 640 (e.g., see FIGS. 5A to 5D and 21) within the first interconnect-level dielectric 312. In operation 2706*b*, the method 2700*b* may further include forming a second interconnect-level dielectric 601 over the heat spreader 640 (e.g., see FIGS. 5A to 5D and 21). In operation 2708*b*, the method 2700*b* may further include forming a phase change material element 306 in or over the second interconnect-level dielectric 601 (e.g., see FIG. 23).

In operation 2710*b*, the method 2700*b* may include forming a heating element 310 over the phase change material element 306. In operation 2712*b*, the method 2700*b* may further include forming a first electrode 1202*a* and a second electrode 1202*b* in contact with the phase change material element 306 (e.g., see FIG. 23). In some embodiments, the method 2700*b* may further include forming a first dielectric layer (e.g., a SiC layer 606) that is in contact with the heat spreader 640 such that the first dielectric layer separates the heat spreader 640 from the heating element 310 (e.g., see FIGS. 25 and 26). The method 2700*b* may further include forming a second dielectric layer (e.g., a silicon oxide layer 608) that separates the heat spreader 640 from the heating element 310 (e.g., see FIGS. 25 and 26).

As described above, both methods (2700*a*, 2700*b*) may include forming a first interconnect-level dielectric 312, forming a heat spreader 640 within the first interconnect-level dielectric 312, forming a second interconnect-level dielectric 601 over the heat spreader 601, forming a phase change material element 306 in or over the second interconnect-level dielectric 601, forming a heating element 310 coupled to the phase change material element 306, forming a first electrode 1202*a* in contact with the phase change material element 306, and forming a second electrode 1202*b* in contact with the phase change material element 306. The phase change material element 306 may include a phase change material, and the first electrode 1202*a*, the second electrode 1202*b*, the heating element 310, and the phase change material element 306 may be configured as a radio frequency switch.

The phase change material element 306 may include a phase change material that switches from an electrically conducting phase to an electrically insulating phase by application of a heat pulse by the heating element 310. Further, the heat spreader 640 may be configured remove heat from one or both of the phase change material element 306 and the heating element 310. In this regard, the heat spreader 640 may be proximate to the heating element 310 (e.g., see FIGS. 20A and 20B) or the heat spreader 640 may be proximate to the phase change material element 306 (e.g., see FIGS. 25 and 26).

Referring to all drawings and according to various embodiments of the present disclosure, a PCM switch (1200, 2000*a*, 2000*b*, 2500, 2600) is provided. The PCM switch (1200, 2000*a*, 2000*b*, 2500, 2600) may include a first interconnect-level dielectric 312, a heat spreader 640 formed within the interconnect-level dielectric 312, a second interconnect-level dielectric 601 formed over the heat spreader 640, a phase change material element 306 formed in or over the second interconnect-level dielectric 601, a first electrode 1202*a* and a second electrode 1202*b* in electrically conductive contact with the phase change material element 306, and a heating element 310 coupled to the phase change material element 306 and configured to supply a heat pulse to the phase change material element 306. The heat spreader 640 may be located proximate to a first one of the phase change material element 306 and the heating element 310 and may remove heat from the first one of the phase change material element 306 and the heating element 310. Further, in certain embodiments, the heat spreader 640 may be smaller than the phase change material element 406.

The PCM switch (1200, 2000*a*, 2000*b*, 2500, 2600) may further include a third interconnect-level dielectric 2002 formed over the phase change material element 306, and an interconnect structure (41, 2602*a*, 2602*b*) formed over the third interconnect-level dielectric 2002 as shown, for example, in FIGS. 20B and 26. In this regard, the interconnect structure (41, 2602*a*, 2602*b*) may be located proximate to a second one of the phase change material element 306 and the heating element 310 and may remove heat from the second one of the phase change material element 306 and the heating element 310. In some embodiments, the PCM switch (1200, 2000*a*, 2000*b*, 2500, 2600) may include a heat spreader 640 having a higher thermal conductivity than the phase change material element 306. The heat spreader 640 may include a non-conductive material (e.g., SiC) in certain embodiments and may include a conductive material (e.g., Cu) in other embodiments.

The PCM switch (1200, 2000*a*, 2000*b*, 2500, 2600) may include a metallization pattern including a conductive line 41 and a conductive via (2602*a*, 2602*b*). Further, the heat spreader 640 may include the same material as the metallization pattern including the conductive line 41 and the conductive via (2602*a*, 2602*b*). In some embodiments, the PCM switch (1200, 2000*a*, 2000*b*, 2500, 2600) may further include a first dielectric layer (e.g., the SiC layer 606) that is in contact with the heat spreader 640. The PCM switch (1200, 2000*a*, 2000*b*, 2500, 2600) may further include a second dielectric layer (e.g., the silicon oxide layer 608) that separates the heat spreader 640 from the phase change material element 306 or the heating element 310. The first dielectric layer 606 may have a higher thermal conductivity than the second layer 608. In this regard, in some embodiments, the SiC layer 606 may be formed over the heat spreader 640 and the silicon oxide layer 608 may be formed over the SiC layer 606.

The heating element 310 may be formed over the second dielectric layer 608 and the phase change material element 306 may be formed over the heating element 310 (e.g., see FIG. 20). In further embodiments, the phase change material element 306 may be formed over the second layer 608 and the heating element 310 may be formed over the phase change material element 306 (e.g., see FIGS. 25 and 26).

In various embodiments, the phase change material element 306 may include a material having a thermal conductivity in a range from approximately 2.5 W/mK to approximately 10 W/mK. For example, the phase change material element 306 may include at least one of a germanium telluride compound, an antimony telluride compound, a germanium antimony telluride compound, a germanium antimony compound, an indium germanium telluride compound, an aluminum selenium telluride compound, an indium selenium telluride compound, and an aluminum indium selenium telluride compound.

In other embodiments, a further PCM switch 2600 may be provided. The PCM switch 2600 may include a heat spreader 640, an interconnect structure (41, 2602*a*, 2602*b*), an interconnect-level dielectric (601, 2002) separating the heat spreader 640 from the interconnect structure (41, 2602*a*, 2602*b*), a phase change material element 306 having a first electrode 1202*a* and a second electrode 1202*b* formed within the interconnect-level dielectric (601, 2002), and a heating element 310 coupled to the phase change material element 306 and configured to supply a heat pulse to the phase change material element 306 (e.g., see FIG. 26).

The phase change material element 306 may include a phase change material that switches from an electrically conducting phase to an electrically insulating phase by application of the heat pulse by the heating element 310. The interconnect structure (41, 2602*a*, 2602*b*) may further include a first interconnect line 41, connected to the first electrode 1202*a* (e.g., connected by the first interconnect via 2602*a*), and a second interconnect line 41, connected to the second electrode 1202*b* (e.g., connected by the second interconnect via 2602; as shown in FIG. 26), such that the first electrode 1202*a*, the second electrode 1202*b*, the phase change material element 306, and the heating element 310 form an RF switch.

In some embodiments, the PCM switch 2600 may further include a carbon-doped silicon layer (e.g., SiC layer 606) that is in contact with the heat spreader 640. The carbon-doped silicon layer may be formed such that it separates the heat spreader 640 from the phase change material element 306 element or the heating element 310. In some embodiments, the PCM switch 2600 may further include a silicon oxide layer 608 that separates the heat spreader 640 from the phase change material element 306 or the heating element 310.

In some embodiments, heating element 310 may include a heater pad 314 that generates heat when an applied voltage generates a current through the heater pad 314. The heating element 310 may further include a dielectric capping layer 316 that is in contact with the phase change material element 306 and that separates the heater pad 314 from the phase change material element 306 (e.g., see FIGS. 25 and 26). In some embodiments, the SiC layer 606 may be formed over the heat spreader 640 and the silicon oxide layer 608 may be formed over the SiC layer 606.

Various disclosed embodiments may provide advantages by providing PCM switches having improved thermal confinement within the phase change material layer and improved thermal diffusion by including a thermal spreader. In this regard, a thermally-conductive dielectric capping layer (e.g., including a high-k dielectric material) located between a heater pad and the phase change material layer of the PCM switch may provide heat to the phase change material layer in a localized region. Further, the presence of a thermal spreader structure may improve removal of thermal energy after switching events. The localized spatial distribution of heat provided to the phase change material may reduce a power required to switch the phase change material. Further, more efficient removal of heat following switching events may increase a switching speed of the PCM switch. In this regard, the PCM switches may be formed in a BEOL process using logic-compatible processes in which the PCM switch is formed in proximity of a heat spreader formed within an interconnect-level dielectric layer using materials and processes similar to those used to form interconnects.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a phase change material (PCM) switch, comprising:
   - forming a first interconnect-level dielectric;
   - forming a heat spreader within the first interconnect-level dielectric;
   - forming a second interconnect-level dielectric over the heat spreader;
   - depositing a continuous heater material layer over an upper surface of the second interconnect-level dielectric;
   - depositing a continuous dielectric capping layer over the continuous heater material layer;
   - patterning and etching the continuous dielectric capping layer and the continuous heater material to form a heater pad and a dielectric capping layer over the heater pad, wherein a side surface of the dielectric capping layer and a side surface of the heater pad form a continuous surface, wherein the heater pad and the dielectric capping layer form a heating element coupled to the phase change material element;

forming a heating element coupled to the phase change material element;

forming a first electrode in contact with the phase change material element; and forming a second electrode in contact with the phase change material element, wherein the phase change material element comprises a phase change material, and wherein the first electrode, the second electrode, the heating element, and the phase change material element are configured as a radio frequency switch.

2. The method of claim 1, further comprising:

forming a carbon-doped silicon layer over the heat spreader such that the carbon-doped silicon layer separates the heat spreader from the heater pad.

3. The method of claim 2, further comprising:

forming a silicon oxide layer over the carbon-doped silicon layer, wherein the continuous heater material layer is deposited over the silicon oxide layer.

4. A method of forming a phase change material (PCM) switch, comprising:

forming a first interconnect-level dielectric;

forming a heat spreader within the first interconnect-level dielectric;

forming a second interconnect-level dielectric over the heat spreader;

forming a trench in the second interconnect-level dielectric;

forming a heater pad within the trench;

recessing an upper surface of the heater pad below an upper surface of the second interconnect-level dielectric;

forming a dielectric capping layer over the recessed heater pad;

forming a phase change material element over the dielectric capping layer and over the upper surface of the second interconnect-level dielectric;

forming a first electrode in contact with the phase change material element; and forming a second electrode in contact with the phase change material element, wherein the first electrode, the second electrode, the heater pad, the dielectric capping layer, and the phase change material element are configured as a radio frequency switch.

5. The method of claim 4, further comprising:

forming a first dielectric layer in contact with the heat spreader, wherein the first dielectric layer separates the heat spreader from the heater pad.

6. The method of claim 5, wherein the first dielectric layer comprises a carbon-doped silicon layer.

7. The method of claim 5, further comprising:

forming a second dielectric layer over the first dielectric layer, wherein the second dielectric layer separates the heat spreader from the heater pad.

8. The method of claim 7, wherein the second dielectric layer comprises a silicon oxide layer.

9. The method of claim 4, wherein the heater pad comprises at least one of tungsten, tungsten nitride, titanium nitride, or nickel silicide.

10. The method of claim 4, further comprising:

forming a third interconnect-level dielectric over the phase change material element; and forming an interconnect structure in or over the third interconnect-level dielectric, wherein the interconnect structure is located proximate to the phase change material element.

11. The method of claim 4, wherein the heat spreader comprises a material having a thermal conductivity in a range from 120 W/mK to 1000 W/mK.

12. A method of forming a phase change material (PCM) switch, comprising:

forming a first interconnect-level dielectric;

forming a heat spreader within the first interconnect-level dielectric;

forming a second interconnect-level dielectric over the heat spreader;

forming a phase change material element over the second interconnect-level dielectric;

forming a heating element over the phase change material element, wherein forming the heating element over the phase change material element comprises forming a heater pad over the phase change material element;

forming a first electrode in contact with the phase change material element; and forming a second electrode in contact with the phase change material element, wherein the phase change material element comprises a phase change material that switches between an electrically conducting phase and an electrically insulating phase by application of a heat pulse from the heating element, and wherein the first electrode, the second electrode, the heating element, and the phase change material element are configured as a radio frequency switch.

13. The method of claim 12, further comprising:

forming a first dielectric layer in contact with the heat spreader, wherein the first dielectric layer separates the heat spreader from the phase change material element.

14. The method of claim 13, wherein the first dielectric layer comprises a carbon-doped silicon layer.

15. The method of claim 13, further comprising:

forming a second dielectric layer over the first dielectric layer, wherein the second dielectric layer separates the heat spreader from the phase change material element.

16. The method of claim 15, wherein the first dielectric layer has a higher thermal conductivity than the second dielectric layer.

17. The method of claim 12, wherein forming the heating element comprises:

forming a heater pad; and forming a dielectric capping layer between the heater pad and the phase change material element, wherein the dielectric capping layer is in contact with the phase change material element.

18. The method of claim 12, further comprising:

forming a third interconnect-level dielectric over the heating element; and forming an interconnect structure in or over the third interconnect-level dielectric, wherein the interconnect structure is located proximate to the heating element.

19. The method of claim 12, wherein the phase change material comprises at least one of a germanium telluride compound, an antimony telluride compound, a germanium antimony telluride compound, a germanium antimony compound, an indium germanium telluride compound, an aluminum selenium telluride compound, an indium selenium telluride compound, or an aluminum indium selenium telluride compound.

20. The method of claim 12, wherein the heat spreader comprises a non-conductive material.

* * * * *